United States Patent [19]
Williams

[11] Patent Number: 6,094,158
[45] Date of Patent: Jul. 25, 2000

[54] FMCW RADAR SYSTEM

[76] Inventor: Roscoe Charles Williams, 46 Fearnley Crescent, Kempston, Bedfordshire MK42 8NL, United Kingdom

[21] Appl. No.: 09/112,850

[22] Filed: Jul. 10, 1998

Related U.S. Application Data

[63] Continuation-in-part of application No. 08/765,082, filed as application No. PCT/GB95/00782, Apr. 5, 1995, Pat. No. 5,818,381.

[30] Foreign Application Priority Data

Jun. 24, 1994 [GB] United Kingdom ................... 9412772

[51] Int. Cl.[7] .............................. G01S 13/93; G01S 7/28
[52] U.S. Cl. ............................ 342/70; 342/175; 342/157
[58] Field of Search ................................ 342/70, 71, 72, 342/107, 109, 115, 128, 175, 100, 103, 157

[56] References Cited

U.S. PATENT DOCUMENTS

| | | | |
|---|---|---|---|
| 2,500,638 | 3/1950 | Krauth | 367/116 |
| 2,511,599 | 6/1950 | Rochester | 342/86 |
| 2,560,587 | 7/1951 | Miller | 367/116 |
| 3,172,075 | 3/1965 | Kay | 367/102 |
| 3,366,922 | 1/1968 | Kay | 367/102 |
| 3,383,682 | 5/1968 | Stephens, Jr. | 342/24 |
| 3,611,374 | 10/1971 | Draysay | 342/28 |
| 3,654,477 | 4/1972 | Benjamin, Jr. | 250/552 |
| 3,987,402 | 10/1976 | Smith | 367/191 |
| 4,310,903 | 1/1982 | Kay | 367/102 |
| 4,574,256 | 3/1986 | Singh | 331/107 SL |
| 4,591,806 | 5/1986 | Havens | 331/96 |
| 4,814,718 | 3/1989 | Argintaru et al. | 329/116 |
| 4,906,947 | 3/1990 | Hart et al. | 331/107 SL |
| 5,008,678 | 4/1991 | Herman | 342/158 |
| 5,199,705 | 4/1993 | Jenkins et al. | 273/26 C |
| 5,229,885 | 7/1993 | Quaglia | 359/665 |
| 5,467,072 | 11/1995 | Michael | 340/436 |
| 5,486,832 | 1/1996 | Hulderman | 342/70 |
| 5,515,056 | 5/1996 | Henderson et al. | 342/125 |
| 5,923,280 | 7/1999 | Farmer | 342/70 |

FOREIGN PATENT DOCUMENTS

| | | |
|---|---|---|
| 0164994 | 12/1985 | European Pat. Off. . |
| 0531877 | 3/1993 | European Pat. Off. . |
| 0536835 | 4/1993 | European Pat. Off. . |
| 0669199 | 8/1995 | European Pat. Off. . |
| 2562679 | 10/1985 | France . |
| 2931837 | 2/1981 | Germany . |
| 3133645 | 3/1983 | Germany . |
| 3613258 | 10/1987 | Germany . |
| 2276055A | 9/1994 | United Kingdom . |

*Primary Examiner*—John B. Sotomayor
*Attorney, Agent, or Firm*—Law Office of Leo Zucker

[57] ABSTRACT

A frequency modulated continuous wave (FMCW) phase shift radar system includes a transmitter, a receiver, and a linearly-tuned oscillator circuit arranged in the transmitter as a source of electromagnetic radiation. The linearly-tuned oscillator circuit has a voltage controlled oscillator (VCO); and a closed loop feedback circuit including a local oscillator and a harmonic mixer coupled to receive a stabilized local oscillator (LO) frequency signal from the local oscillator and a radio frequency (RF) signal from an output of the voltage controlled oscillator. The harmonic mixer mixes the LO frequency signal with the RF signal to produce an intermediate frequency (IF) signal, and a linear frequency discriminator is coupled to receive the IF signal and to produce an output voltage signal which is applied to an input of the VCO to stabilize the latter, thus completing the feedback circuit. A signal processing unit is coupled to the receiver to compute the range and the velocity of objects detected by the system, and a miniature front-end assembly includes a planar phased array, and a planar circuit including the VCO, the stabilized LO, and the harmonic mixer.

29 Claims, 19 Drawing Sheets

FMCW RADAR SYSTEM

REFERENCE TO RELATED APPLICATION

This application is a continuation-in-part of my U.S. application Ser. No. 08/765082 filed Dec. 20, 1996 and entitled "Electronic Viewing Aid" now U.S. Pat. No. 5,818,381. The '082 application was filed under the provisions of 35 USC §371 from International application PCT/GB95/00782 filed Apr. 5, 1995, with a claim for priority based on UK Application GB 9412772.7 filed Jun. 24, 1994. The '082 application issued as U.S. Pat. No. 5,818,381 on Oct. 6, 1998. See also applicant's copending application Ser. No. 09/112,854 filed Jul. 10, 1998, and entitled "Oscillator Circuit" still pending.

TECHNICAL FIELD

This invention relates to a FMCW radar system and to various applications of that system.

BACKGROUND ART

Radar systems are well known for an ability to detect and track stationary and moving targets, and have achieved wide-spread use in navigation systems for vehicles such as aircraft and shipping. The size, complexity and expense of such systems, however, precludes their use in certain applications, particularly those in which the radar system must be small and light. Such systems are required for example in vehicle collision avoidance, cruise control and air bag deployment systems, collision avoidance and altimeter systems for aircraft and guided missiles, security systems such as intruder alarms and robotic control and guidance systems, for example for use in robotic vacuum cleaners and lawn mowers, in unmanned planetary exploration vehicles and in toys.

Various vehicle collision avoidance systems are described, for example, in more detail in British patent applications Nos: GB 2262829A and GB 2266803A, European patent application No. EP 0605104 A1, and U.S. Pat. No. 5,289,182.

Although radar systems of a relatively small size have been developed for use as speed detectors in motor vehicle traffic control and as proximity detectors in motor vehicles, these systems have generally lacked the performance characteristics necessary for widespread usage in many potential applications, particularly those in which it is necessary to detect and track accurately both stationary and moving objects within the immediate vicinity. Another problem with many known systems is that they require bulky wave guides, which cannot easily be accommodated within, for example, the body of an automobile without adversely affecting the appearance of the vehicle.

Other problems with the radar systems used in known vehicle collision avoidance systems include that the beam width is too large, for example more than 10° at mm wavelengths, so that the radar is unable to distinguish objects less than 17 m apart at a range of 100 m; that the detector and the receiver are sensitive to changes in the ambient temperature; and that they are unable to detect both stationary objects and the velocity of moving objects.

It is an object of the present invention to provide a FMCW (frequency modulated continuous wave) radar system that mitigates at least some of the aforesaid problems.

SUMMARY OF THE INVENTION

According to the invention there is provided a FMCW phase shift radar system that is capable of detecting both stationary and moving objects, said radar system including:

a transmitter and a receiver, a linearly-tuned oscillator circuit arranged in said transmitter as a source of said electromagnetic radiation, a signal processing unit coupled to an output of said receiver, and a miniaturised front end assembly constructed and arranged to produce millimeter wavelength electromagnetic radiation, said miniaturised front end assembly including planar phased array antennae having very narrow beam width characteristics.

Advantageously, said oscillator circuit includes:

a voltage controlled oscillator, and a closed loop feedback circuit, said closed loop feedback circuit containing:

a local oscillator, a harmonic mixer connected to receive a stabilised local oscillator (LO) frequency signal from said local oscillator and a radio frequency (RF) signal from an output of said voltage controlled oscillator, said harmonic mixer being arranged to mix said LO frequency signal with said RF signal to obtain an intermediate frequency (IF) signal, and a linear frequency discriminator connected to receive said IF signal and arranged to provide an output voltage signal that is fed to an input of said voltage controlled oscillator to stabilise the voltage controlled oscillator. Alternatively, said local oscillator may include a dielectric resonator, a Gunn/Impatt diode and a low-pass filter.

Advantageously, said voltage controlled oscillator includes a voltage-controlled Gunn diode, a two-section transformer connected to said Gunn diode, a varactor and a bypass capacitor. Alternatively, said voltage controlled oscillator includes a GaAS field effect transistor or a MESFET, HEMT or PHEMT transistor oscillator.

Advantageously, said closed loop feedback circuit includes an IF amplifier connected between said harmonic mixer and said linear frequency discriminator to amplify said IF signal.

Advantageously, said transmitter includes a summing amplifier connected between said linear frequency discriminator and said voltage controlled oscillator, said summing amplifier having a first input that is connected to receive said output signal from said linear frequency discriminator, a second input that is connected to receive a control signal and an output connected to an input of said voltage controlled oscillator to control and stabilise the voltage controlled oscillator.

The transmitter may include a linear ramp generator that is connected to said second input of said summing amplifier, to provide said control signal.

Advantageously, the transmitter having an operating frequency in the range 30–220 GHz, preferably approximately 94 GHz.

Advantageously, said receiver includes:

a receive antenna having an output for a received signal, a coupler coupled to said transmitter to detect a transmitted signal, a mixer connected to said antenna and said coupler, said mixer being arranged to mix said received signal with said transmitted signal to obtain an intermediate frequency (IF) signal, a filter connected to an output of said mixer to filter said IF signal, and an analogue-to-digital converter connected to receive said IF signal and arranged to provide a digital output signal that is fed to an input of said signal processing unit.

Advantageously, the mixer is a radio-frequency hybrid ring mixer.

Advantageously, the planar phased array comprises a rectangular array of microstrip elements on a dielectric substrate, and said elements are connected together by a series of diagonal high impedance lines. Said array is advantageously conformable.

Advantageously, the radar system includes a plurality of planar phased arrays connected together to form an interferometer. This allows small objects to be detected at long ranges. The radar system may include a microstrip circuit and/or a monolithic millimeter wave integrated circuit.

In a preferred embodiment, the radar system includes a miniaturised radar front end assembly operating with millimeter wavelength electromagnetic radiation, an electrical power source, signal processing means and a sensory output means.

The electronic viewing aid according to the present invention is devised to operate with electromagnetic radiation whose wavelength lies in the millimeter region, with frequencies which lie between 35 and 220 gigahertz (GHz). The frequency used to operate the preferred embodiment of the present invention is 94 GHz.

The radar system used in the present invention has been reduced in size both by the choice of the small wavelength of the operating radiation used and the use of miniaturising techniques in the fabrication of the system. Thus microstrip technology is used to produce the various transmission lines and passive electronic components required in radio-frequency (RF) and intermediate frequency (IF) stages of the system, and thick film hybrid techniques are utilised for low frequency components of the system. Expensive machined components such as wave guides are not used in the system. In the invention, the radar system is a frequency-modulated continuous wave type, which is lower in cost than some other types of radar system, such as, for example, the monopulse type of radar system.

The antennae are also conformable: that is they can be moulded to different shapes including, for example, the shape of an external body panel or bumper of a vehicle. They can therefore be mounted on a vehicle body without significantly affecting the vehicle's appearance.

A feature of the electronic viewing aid of the present invention is that, by using an operating radiation of millimeter wavelength and microstrip fabrication technology, it is possible to produce planar phased array antennae that possess very narrow beam width characteristics, e.g., 2 degrees at 94 GHz. Thus the radar system can scan a particular volume of space and can readily determine the physical existence and extent of any objects therein, provided that those objects do not subtend an angle of less than two degrees at the antennae of the radar system. This means in practice that the system can distinguish objects as little as 2.5 m apart at a distance of 100 meters.

Moreover, the operating radiation of millimeter wavelength used in the radar system of the present invention is subject to relatively low levels of attenuation in environments having low visibility, such as fog, dust or smoke. Thus, for example, the one-way attenuation of 94 GHz radiation in thick fog is approximately 3 dB/km, whereas it is approximately 100 dB/km for infra-red radiation. The penetration of fog and smoke by 94 GHz radiation is clearly far superior to that of infra-red radiation. Consequently, the radar system of the present invention, can be used in conditions of poor visibility, such as cloud or fog, to detect the presence of any objects or obstacles.

The radar system of the present invention can be used in vehicle collision avoidance, cruise control and air bag deployment systems, collision avoidance systems for aircraft, altimeter systems for aircraft and guided missiles, security systems, robotic control and guidance systems, for example for use in robots, in unmanned planetary exploration vehicles and in toys.

BRIEF DESCRIPTION OF DRAWINGS

FIG. 11b is a graphical representation of a signal generated within the microstrip circuit shown in FIG. 11a;

FIG. 11c is a graphical representation of an output signal generated within the microstrip circuit shown in FIG. 11a;

BEST MODE FOR CARRYING OUT THE INVENTION

Figure 1:
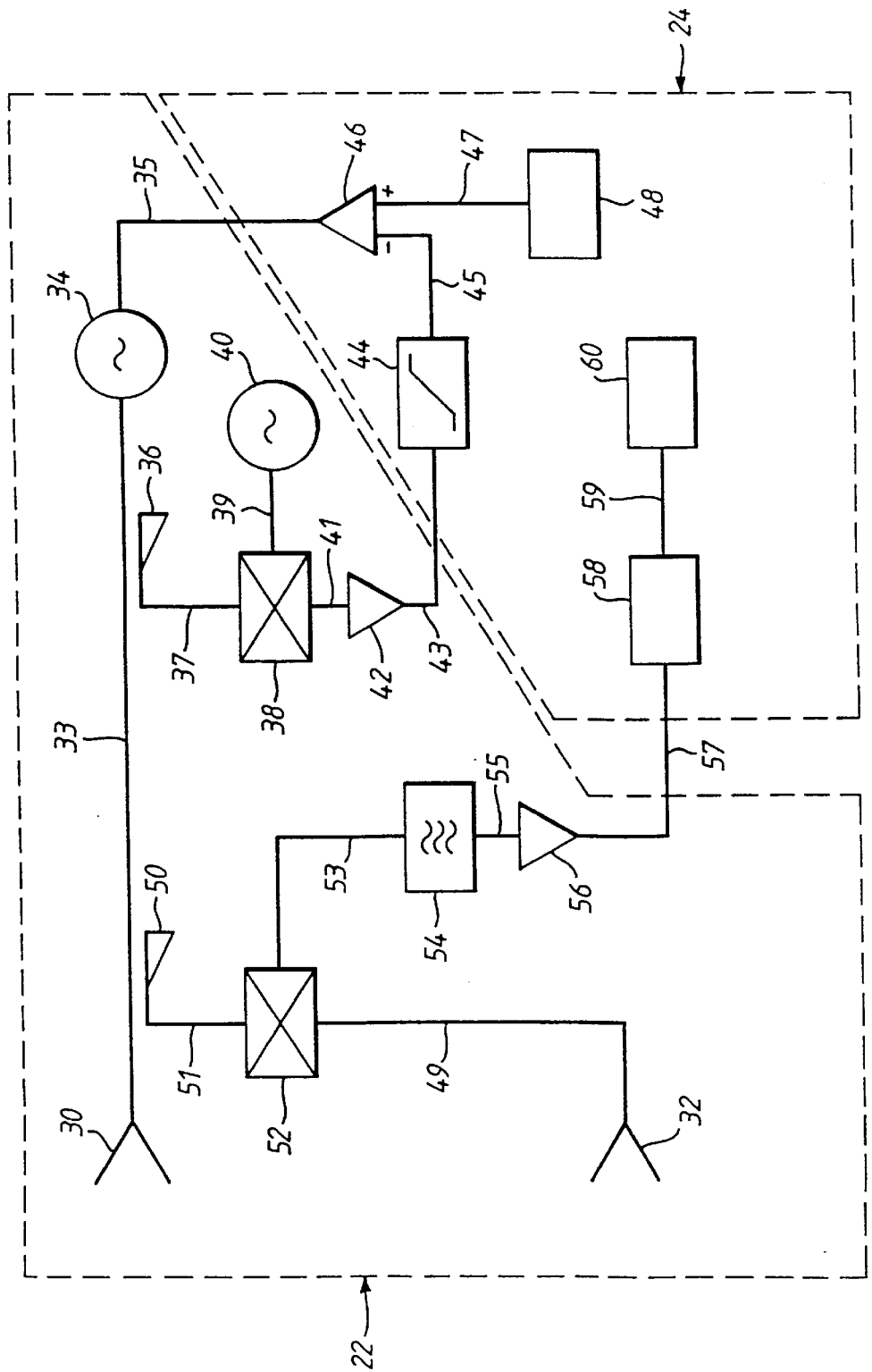
FIG. 1 is a schematic circuit drawing of a preferred embodiment of a radar system according to the present invention.

A preferred embodiment of an FMCW radar system according to the present invention is illustrated in FIGS. 1 to 26, which includes a radar front end assembly hereinafter referred to as a SMART system 22. Referring now to FIG. 1, this shows a schematic circuit drawing for the SMART system 22 and portions of a remotely-mountable signal processing and power unit 24 of the preferred embodiment of the radar system. The SMART system 22 includes a transmit antenna 30 and a receive antenna 32. Transmit antenna 30 is connected by a microstrip transmission line 33 to the output of a transmitter closed loop circuit that includes a voltage-controlled oscillator 34, a coupler 36, a harmonic mixer 38, a local oscillator 40, an amplifier 42, a linear frequency discriminator 44 and a summing amplifier 46.

In the operation of this closed loop circuit, the local oscillator 40 produces a stabilised local oscillator (LO) frequency signal which is fed to one input of the harmonic mixer 38 through a microstrip transmission line 39. A small amount of radio-frequency (RF) energy is taken from the transmission line 33 by the coupler 36, and is fed to a second input of the harmonic mixer 38 through a microstrip transmission line 37. The harmonic mixer 38 mixes the RF signal from the coupler 36 with the LO frequency signal from the local oscillator 40 to obtain a beat frequency, termed the intermediate frequency (IF), which is fed to the input of the intermediate frequency amplifier 42 through a microstrip transmission line 41. Components 36, 38, 40 and 42 all form part of the SMART system 22.

The output signal from the IF amplifier 42 is fed through an output line 43 to a linear frequency discriminator 44 which is housed within the remote unit 24. The frequency discriminator 44 produces an output voltage signal that is fed into one input of the summing amplifier 46 through an output line 45. The summing amplifier 46 is also housed within the remote unit 24, along with a linear ramp generator 48. The linear ramp generator 48 produces a saw-tooth voltage signal, which is fed to a second input of the summing amplifier 46 through an input line 47. An output signal from the summing amplifier 46 is fed to an input of the voltage-controlled oscillator 34 through an output line 35. The voltage-controlled oscillator 34 incorporates a voltage-controlled Gunn diode, and is described in more detail hereinafter with reference to FIGS. 12a and 12b. The wave form of the output signal from the summing amplifier 46 produces an output signal from the voltage-controlled oscillator 34 that is frequency modulated, and this frequency-modulated output signal is fed to the transmit antenna 30 through the microstrip transmission line 33 to close the loop.

This closed loop transmitter circuit uses the frequency discriminator 44 to provide a feedback signal that stabilises the tuneable voltage-controlled oscillator 34. The voltage-controlled oscillator 34 is effectively "locked" to a tuning characteristic of the frequency discriminator 44, as is shown graphically hereinafter with reference to FIGS. 11b and 11c. Since this tuning characteristic is linear, the voltage-controlled oscillator 34 will be tuned linearly.

During the operation of the radar system a radar signal is transmitted from the transmit antenna and any object in the path of that signal will scatter a certain fraction of the transmitted signal back to the receiver antenna 32 of the SMART system 22. The return signal collected by the receive antenna 32 is fed to one input of a radio-frequency hybrid ring mixer 52 through a microstrip transmission line 49. A coupler 50 located adjacent the transmitter output line 33 acts as a local oscillator by taking a small portion of the transmitter signal and feeding it to a second input of the hybrid ring mixer 52 through a microstrip transmission line 51. The hybrid ring mixer 52 is described in more detail hereinafter with reference to FIG. 13. Hybrid ring mixer 52 produces an intermediate frequency (IF) signal, which is a beat frequency that is equal to the difference in frequency between the transmitted and received signals fed to the two inputs of the hybrid ring mixer 52.

The IF signal from the hybrid ring mixer 52 is fed through a microstrip transmission line 53 to an input of a low-pass filter 54, which is designed to allow only the IF signal to pass through to an input of an IF amplifier 56 via a microstrip transmission line 55. The IF amplifier 56 produces an amplified IF output signal which is fed to an input of an analogue-to-digital converter (ADC) 58 through an output line 57. The amplified IF signal is converted from an analogue signal to a digital signal by the ADC 58, and the digital output signal from the ADC 58 is passed to an input of a signal processing unit 60 through an output line 59. Both the ADC 58 and the signal processing unit 60 are housed in the remote unit 24.

The signal processing unit 60 computes the range and velocity of the object(s) detected relative to the system, and, where possible, identifies said object(s). The signal processing unit 60 contains object-recognition algorithms to aid in the identification of detected objects, and generates an output signal embodying all of the detected characteristics of said object(s).

Figure 2:
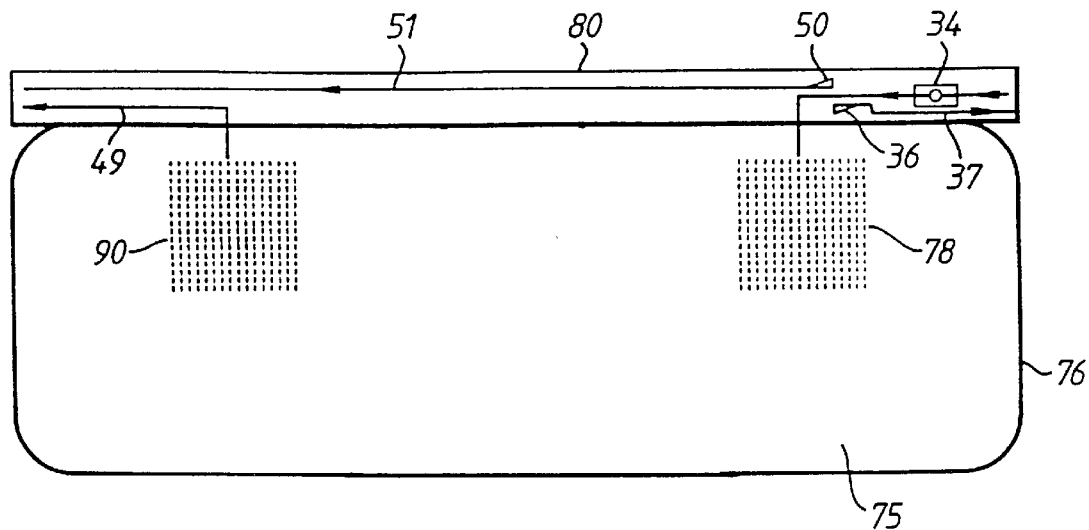
FIG. 2 shows a front end assembly of the radar system shown in FIG. 1.
Figure 3:
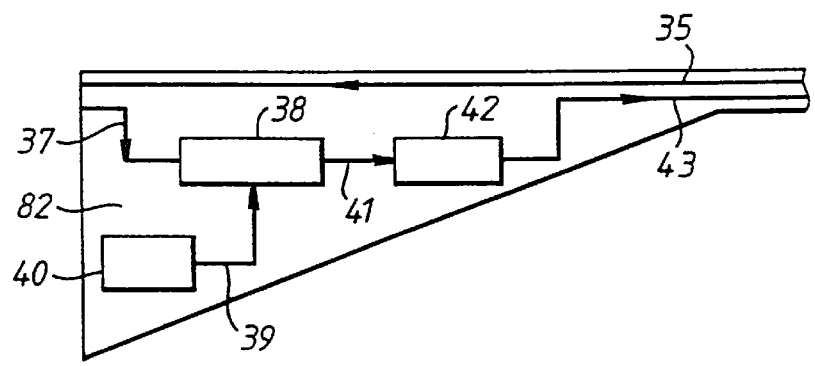
FIG. 3 shows a transmitter circuit of the front end assembly shown in FIG. 2.
Figure 4:
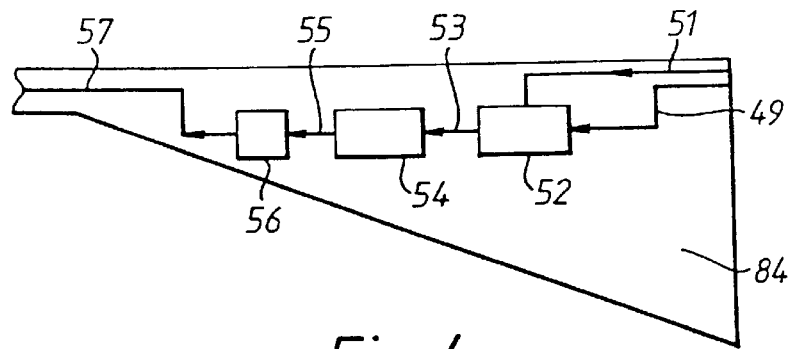
FIG. 4 shows a receiver circuit of the front end assembly shown in FIG. 2.

Turning now to FIGS. 2, 3 and 4, these illustrate the desired configuration of the SMART system 22 of the preferred embodiment of the invention. FIG. 2 shows a front view of the SMART system 22, from which it can be seen that it comprises a substrate 75 supported by a frame 76 having an upper, horizontal cross-bar 80. The substrate 75 is formed from a suitable dielectric substance such as quartz, and the cross-bar 80 is a rectangular piece of a suitable dielectric substrate (e.g., alumina) mounted upon metal ground plane. The substrate 75 carries a first planar phased array 78, which constitutes the transmit antenna 30 of FIG. 1, and a second planar phased array 90, which constitutes the receive antenna 32 of FIG. 1. The cross-bar 80 carries thereon the voltage-controlled oscillator 34, the coupler 36, and the microstrip transmission line 33, 35 and 37 of the transmitter circuit of the radar system shown in FIG. 1, and the coupler 50 and the microstrip transmission lines 49 and 51 of the receiver circuit of the radar system shown in FIG. 1.

FIG. 3 is a side view of a support 82 for a transmitter circuit of the SMART system 22, which support is made from a suitable dielectric material substrate, such as alumina, mounted on a metal ground plane. The support 82 carries thereon the harmonic mixer 38, the local oscillator 40, the amplifier 42 and the microstrip transmission lines 35, 37, 39, 41 and 43 of the transmitter circuit of the radar system shown in FIG. 1.

FIG. 4 is a side view of a support 84 for a receiver circuit of the SMART system 22, which support 84 is made from a suitable dielectric material substrate, such as alumina, mounted on metal ground plane. The support 84 carries thereon the hybrid ring mixer 52, the low-pass filter 54, the IF amplifier 56 and the microstrip transmission lines 49, 51, 53, 55 and 57 of the receiver circuit of the radar system shown in FIG. 1.

Figure 6:
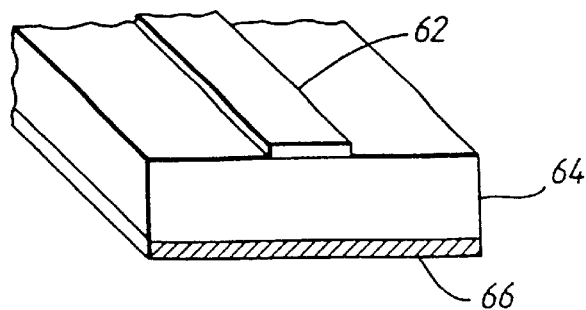
FIG. 6 is an isometric view, partially in section, of a portion of a microstrip transmission line used in the circuit of the radar system shown in FIG. 1.

FIG. 6 is a an isometric, cross-sectional view of a portion of a microstrip transmission line as used from the transmission lines in the SMART system 22. As can be seen in FIG. 6, the transmission line comprises a metal strip conductor 62 deposited upon an upper surface of an insulating slab-like member 64 formed from a dielectric material, with a lower surface of the slab-like member 64 being plated with a metal conductive film 66.

Figure 7:
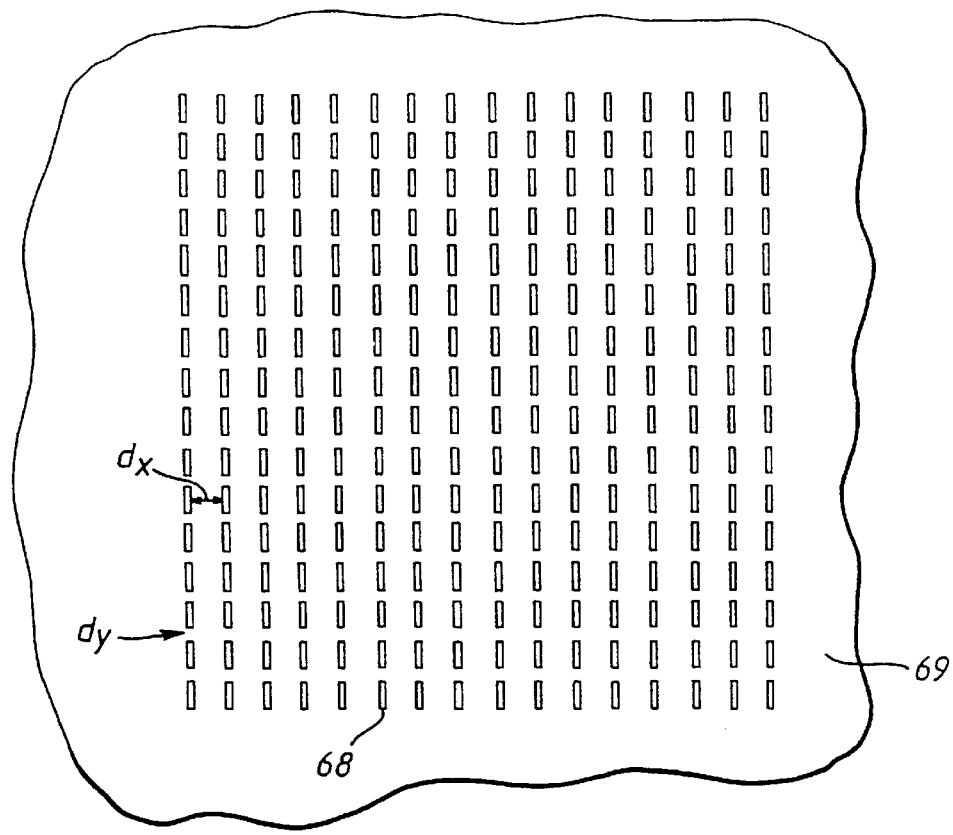
FIG. 7 is a plan view of a planar phased array used in the front end assembly shown in FIG. 2.
Figure 8:
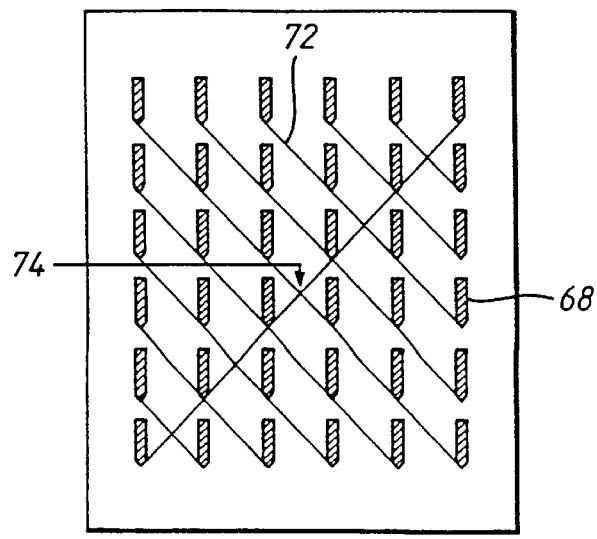
FIG. 8 is a plan view of a portion of the planar phased array shown in FIG. 7, illustrating a microstrip feed pattern for the array.

FIGS. 7 and 8 show details of the planar phased array as used for the transmit array 78 and the receive array 90 in the SMART system 22 as shown in FIG. 2. Each planar phased array comprises 64 metal microstrip elements 68 deposited in a 16×16 array upon the surface of a quartz substrate 69, which forms the substrate 75 of the SMART system 22 for the array. Each of the metal microstrip elements 68 is rectangular in shape, with a length of 0.752 mm and a width of 0.188 mm. The quartz substrate 69 has a thickness of 0.13 cm. As shown in FIG. 7, the horizontal distance $d_x$ between adjacent microstrip elements 68 is 1.063 mm, and the vertical distance $d_y$ between adjacent microstrip elements 68 is 0.3114 mm.

FIG. 8 shows a 6×6 array portion of the planar phased array of FIG. 7 to illustrate a preferred network arrangement of directly-fed elements 68 in which the elements 68 are connected together by a series of diagonal high impedance lines 72. The radiation fed to or from the array during the operation of the SMART system 22 enters the network of high impedance lines 72 from a common feed point 74 which extends through the quartz substrate 69 to a miniature co-axial connector (not shown) mounted thereon. An alternative method of feeding signal power to, for example, the elements 68 of the transmit array 78 is to connect each element 68 through the substrate 69 to a parallel feed network, so as to fan out the transmitted power to each element 68 through the substrate 69. Such a parallel feed network is not as cost-effective as the cross-fed array illustrated in FIG. 8.

Figure 9:
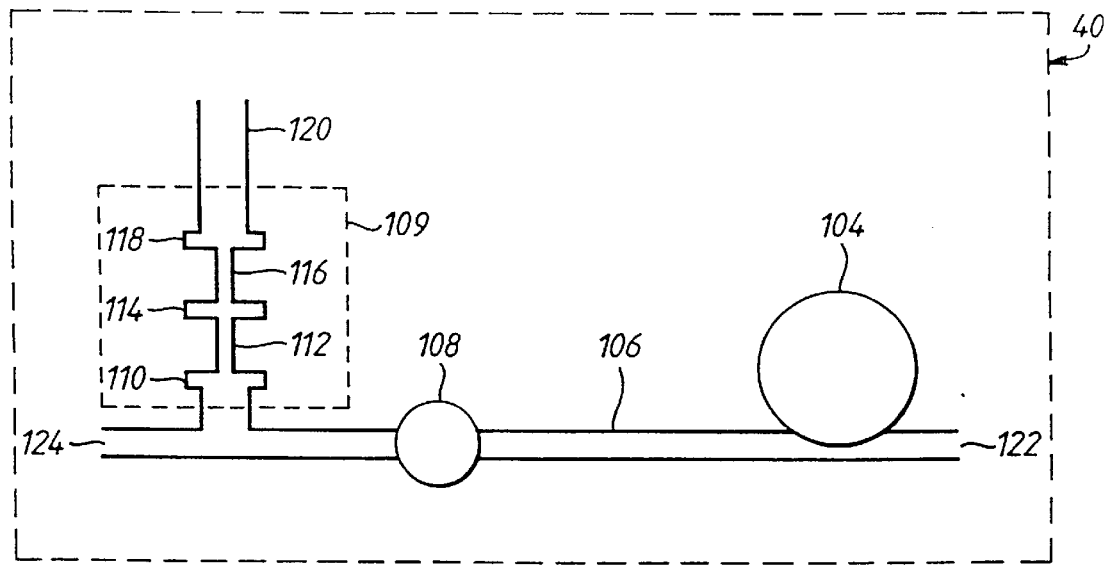
FIG. 9 is a schematic diagram of a microstrip circuit of a local oscillator component of the radar system shown in FIG. 1.

FIG. 9 shows circuit details of the local oscillator 40 of the transmitter closed loop circuit of the SMART system 22. The circuit components of the local oscillator 40 are mounted upon an alumina substrate having a relative dielectric constant of 9.6 and a thickness of 0.38 mm. The circuit components comprise a dielectric resonator 104, a Gunn/Impatt diode 108, and a low-pass filter 109. Dielectric resonator 104 is a cylinder with a radius of 1.3345 mm and a height of 1.01098 mm, formed of barium tetratitanate which has a dielectric constant of 36.5. The resonant frequency of the cylindrical resonator 104 is 23.25 GHz. The dielectric resonator 104 is connected to the Gunn/Impatt diode 108 via a 50 ohm microstrip transmission line 106, with the distance between the dielectric resonator 104 and the diode 108 being 5.0 mm. During the operation of the SMART system 22, the diode 108 is frequency-stabilised by reason of the dielectric resonator oscillating at a fixed frequency of 23.25 GHz. The low-pass filter 109 is positioned between the diode 108 and a radio-frequency output line 124 of the local oscillator 40, and DC power is fed to the local oscillator 40 via a 50 ohm input line 120. Low-pass filter 109 comprises an array of microstrip elements 110, 112, 114, 116 and 118, elements 110, 114 and 118 being capacitor elements with respective values of 0.0976 pF, 0.0891 pF and 0.0868 pF, and elements 112 and 116 being inductance elements with respective values of 0.4724 nH and 0.2956 nH. A microstrip transmission line 122 connected to the dielectric resonator 104 is coupled to a dummy load.

Figure 10:
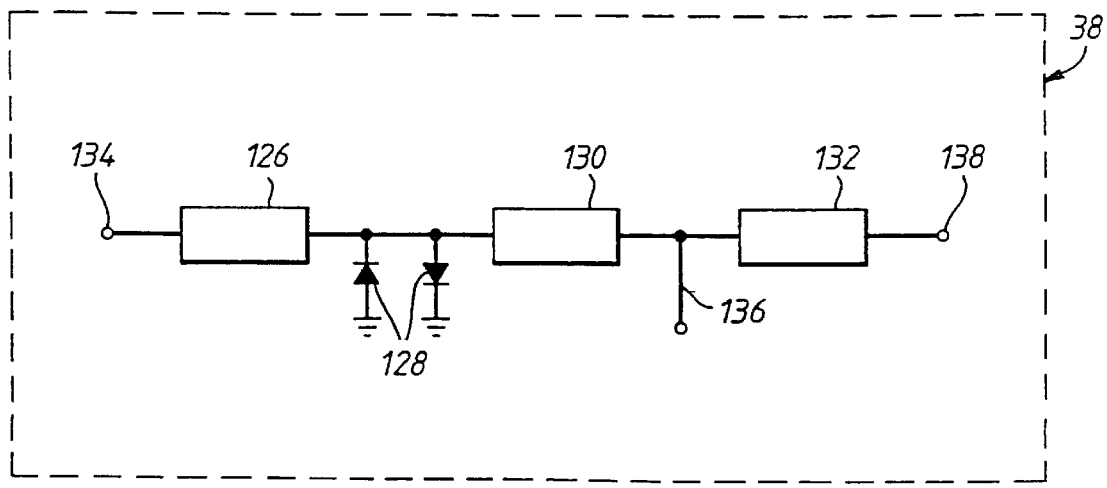
FIG. 10 is a schematic diagram of a microstrip circuit of a harmonic mixer component of the radar system shown in FIG. 1.

Turning now to FIG. 10, this shows the microstrip circuit of the harmonic mixer 38 of the transmitter closed loop circuit of the SMART system 22. The circuit components of the harmonic mixer comprise a radio-frequency bandpass filter 126, two beam-lead diodes 128 arranged in an antiparallel configuration, a low-pass filter 130 and an intermediate frequency filter 132, all connected together in series as shown. Filter 126 is provided with an input port 134, filter 132 is provided with an output port 138, and there is an input port 136 provided in the connection between filters 130 and 132.

During the operation of the SMART system 22, the output from coupler 36 (see FIG. 1) is fed to port 134, the output from local oscillator 40 is fed to port 136, and the intermediate frequency output signal generated in the harmonic mixer 38 exits from port 138. The RF bandpass filter 126 is used to suppress all the higher order of frequencies generated in the mixer 38, and to reject passage of the local oscillator frequency signal and the intermediate frequency signal. The RF bandpass filter 126 consists of a quarter wave line 0.2574 mm long, which gives sufficient rejection of the local oscillator signal and the IF signal during operation thereof. The low-pass filter 130 is used during operation to pass the local oscillator frequency signal whilst preventing the radio-frequency signal from reaching the local oscillator input port 136. This low-pass filter 130 has a cut-off frequency of 25 GHz. The intermediate frequency filter 132 has the same circuit configuration and component values as the low-pass filter 109 used in the local oscillator 40. It is used, during operation of the SMART system 22, to extract the intermediate frequency signal generated in the mixer 38 whilst preventing the local oscillator signal and any other unwanted residual frequencies from reaching the output port 138. The IF filter 132 has a cut-off frequency of 22 GHz. The mixer 38 is designed to operate on the fourth harmonic of the local oscillator signal. Consequently, since the local oscillator signal is 23.25 GHz, the fourth harmonic thereof is a frequency of 93 GHz, and, with the radio-frequency signal having a frequency of 94 GHz, the intermediate frequency signal exiting the mixer 38 will have a frequency of 1 GHz.

Figure 11A:
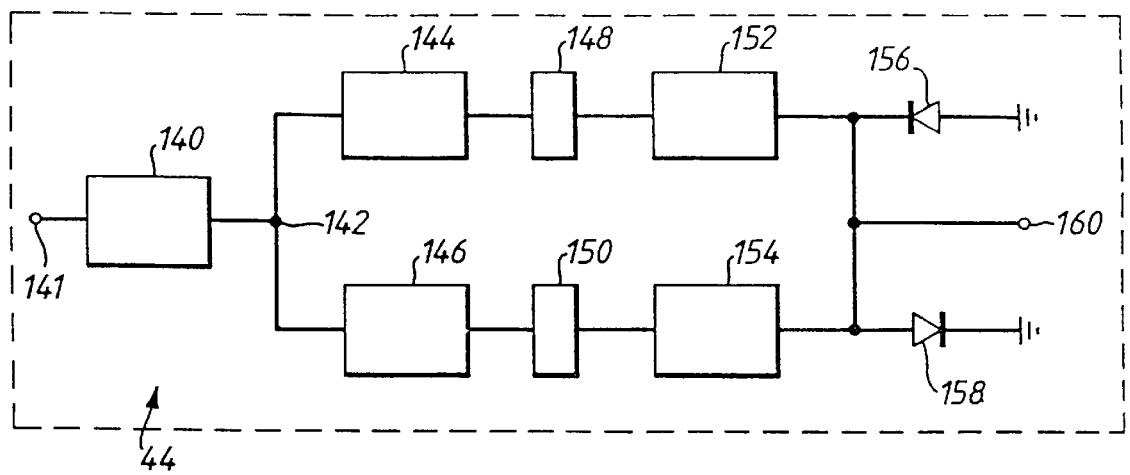
FIG. 11a is a schematic diagram of a microstrip circuit of a linear frequency discriminator component of the radar system shown in FIG. 1.

FIG. 11a shows the microstrip circuit of the linear frequency discriminator (LFD) 44 of the transmitter closed loop circuit of the SMART system 22. The circuit components of the linear frequency discriminator 44 comprise a frequency divider 140 having an input port 141, a power splitter 142, matching networks 144 and 146 for respective resonators 148 and 150, matching networks 152 and 154 for respective diodes 156 and 158, and an output port 160. Since the LFD 44 is located in the digital section of the radar system that is housed in the remote unit 24, the transmission lines connecting the circuit components together need not be of microstrip construction, but can be produced by printed circuit techniques or by wire.

During the operation of the SMART system 22, the frequency divider 140 divides the intermediate frequency signal received at the input port 141 down to a range that is suitable for digital operation, e.g., MHz frequency, and feeds that divided signal to the power splitter 142, which performs a 3 dB power split of the signal. The split signals thus produced are fed respectively to the matching networks 144 and 146 for the respective resonators 148 and 150. The resonators 144 and 146 shown in FIG. 11*a* are quartz resonators, but they could be tuned passive circuits, tuned amplifiers or cavities, if desired, and, since the LFD 44 is located in the digital section of the radar system that is housed in the remote unit 24, they could also be digital notch filters. The networks 144, 146, 152 and 154 can be passive or active matching networks. The pair of matching diodes 156 and 158 are arranged in an anti-parallel configuration, and are used to produce an output signal at the output port 160, as will now be described with reference to the graphs shown in FIGS. 11*b* and 11*c*.

Figure 11B:
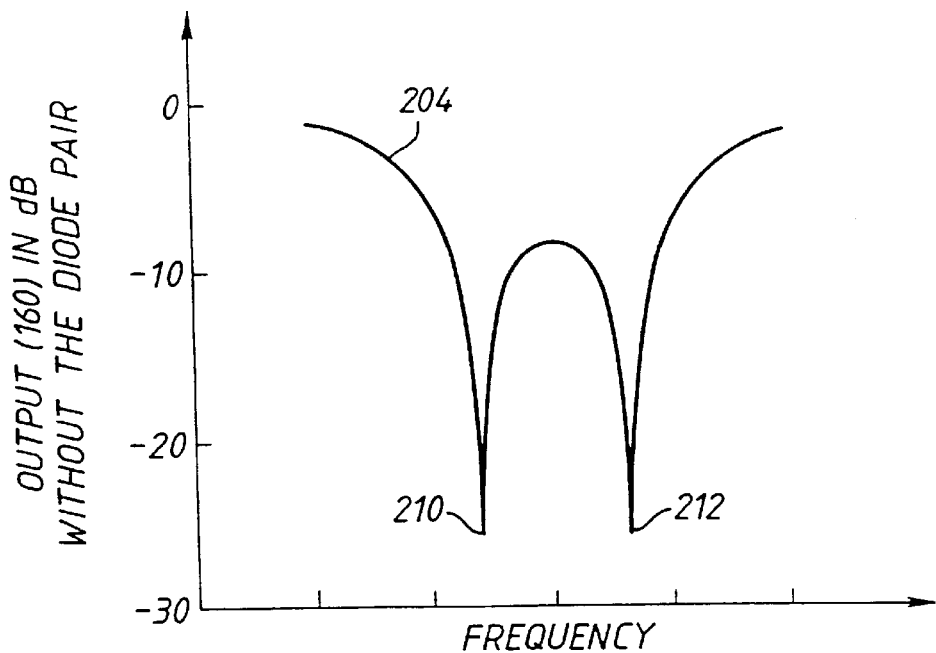
Figure 11C:
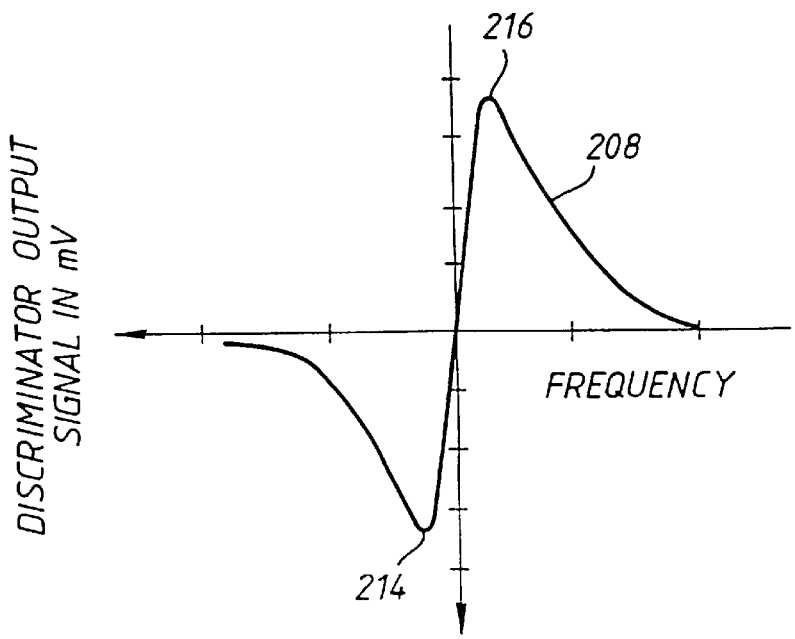

Referring first to FIG. 11*b*, this shows a graphical representation of the output 204 of the matching networks 152 and 154 when the RF signal at the input port 141 is scanned over the frequency range. As can be seen from the graph, the curve for the output 204 contains two troughs therein, indicated by the reference numbers 210 and 212 respectively. Trough 210 corresponds to the resonant frequency of the resonator 148, and trough 212 corresponds to the resonant frequency of the resonator 150. When the output signal 204 is fed to the pair of diodes 156 and 158, a discriminator output signal is produced at the output port 160 as a result of this diode pair combining the output signal 204, which discriminator output signal 208 is shown graphically in FIG. 11*c*. As can be seen in FIG. 11*c*, the curve for the output signal 208 contains a trough 214, which corresponds to the resonance trough 210 shown in FIG. 11*b*, and a peak 216, which corresponds to the resonance trough 212 shown in FIG. 11*b*.

As can been seen in FIG. 1, the output signal from the LFD 44 is fed to a negative input port on the summing amplifier 46, wherein it is combined with the saw-tooth voltage signal from the linear ramp generator 48, which is fed to a positive input of the summing amplifier 46, to produce an output signal that is fed to an input of the voltage-controlled oscillator 34.

Figure 12A:
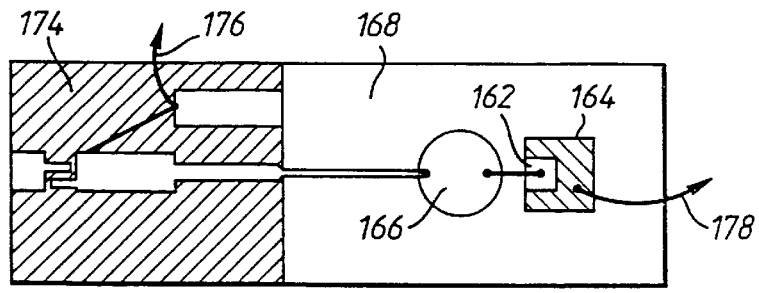
FIG. 12a is a plan view of a voltage-controlled oscillator component of the radar system shown in FIG. 1.
Figure 12B:
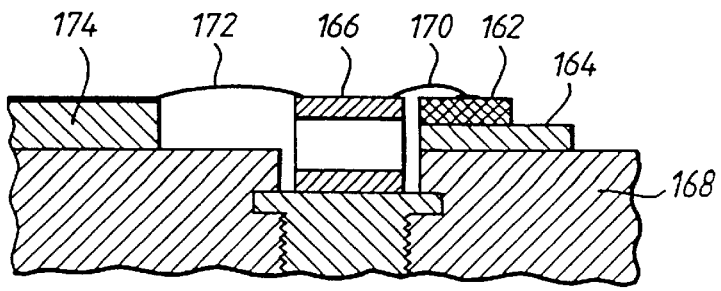
FIG. 12b is a cross-sectional view of a voltage-controlled oscillator component of the radar system shown in FIG. 1.

FIGS. 12*a* and 12*b* show details of the structure of the voltage-controlled oscillator 34. The main circuit components of the VCO 34 comprise a varactor 162, a bypass capacitor 164 and a Gunn diode 166, all mounted upon a metal carrier 168. As can be seen in FIG. 12*b*, the Gunn diode 166 has a threaded base which is screwed into a threaded aperture in the metal carrier 168, the varactor 162 is bonded to the Gunn diode 166 by a wire 170, and a gold ribbon 172 connects the Gunn diode to a two-section transformer 174, which is used for an impedance match in the VCO 34. As can be seen in FIG. 12*a*, a Gunn bias line 176 is provided which is connected to the power supply cable 102 of the SMART system 22, and a varactor bias line 178 is provided which is connected to the output line 35 from the summing amplifier 46 (see FIG. 1). The VCO 34 includes a dielectric substrate material of alumina.

Figure 17:
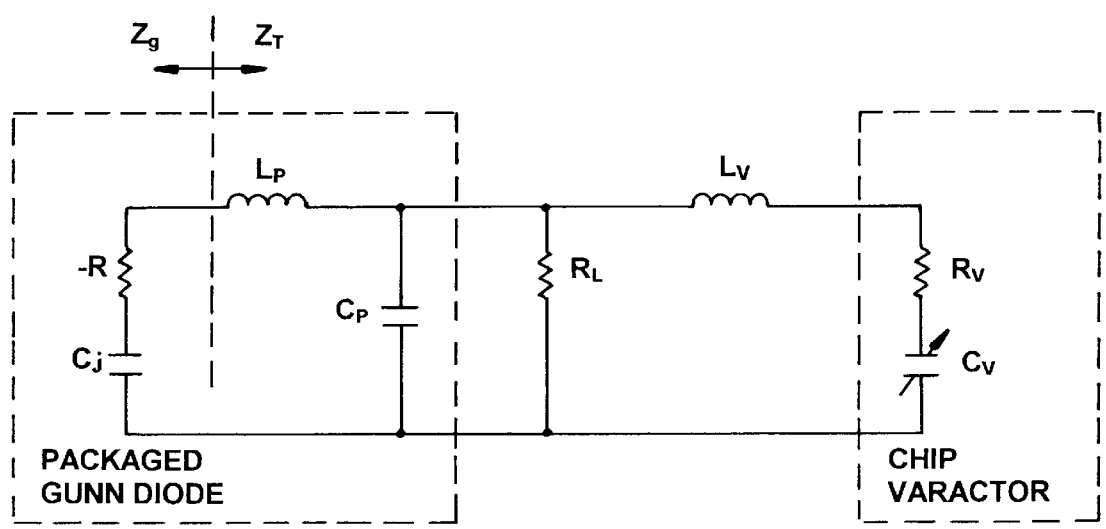
FIG. 17 is a schematic circuit diagram of the equivalent circuit of the varactor controlled oscillator circuit.

The equivalent circuit of the Gunn VCO 34 is given in FIG. 17. It contains the following circuit elements:

| Gunn Diode 166 | |
|---|---|
| Negative resistance: $-R$, | Junction capacitance: $C_j$ |
| Package inductance: $L_p$, | Package capacitance: $C_p$ |
| Transformer 174 | Varactor 162 |
| Transformed load impedamce: $R_L$ | Series resistance: $R_V$ |
| Bonding wire inductance: $L_V$ | Capacitance: $C_V$ |

When the varactor chip is disconnected, the Impedance of the Gunn $Z_g$ is given by:

$$Z_g = -R - \frac{i}{\omega C_j} \qquad (1)$$

The impedance of the varactor $Z_v$ is given by:

$$Z_v = R_V + i\left(\omega L_V - \frac{1}{\omega C_V}\right) \qquad (2)$$

The time constant $$\tau_1 = R_L C_p \qquad (3)$$

The transformed impedance $Z_T$ can be expressed in terms of $Z_v$, $\tau_1$, $R_L$ and $L_p$ i.e.

$$Z_T = i\omega L_p + \frac{R_L Z_V}{R_L + Z_V(1 + i\omega\tau_1)} \qquad (4)$$

The following two equations specify the conditions for oscillation:

$$\mathcal{Im}(Z_g) = -\mathcal{Im}(Z_T) \qquad (5)$$

$$\mathcal{Re}(Z_g) > \mathcal{Re}(Z_T) \qquad (7)$$

If the values of the Gunn diode impedance $Z_g$ and of the transformed impedance $Z_T$ given by equations (1) and (4) respectively are inserted into the equation for the oscillation condition given by equation (5) one obtains the following expression for the Gunn diode junction capacitance $C_j$:

$$C_j = \frac{1 + \omega^2 \tau_1^2}{\omega^2 L_p - \omega^2 R_L \tau_1 + \omega^4 \tau_1^2 L_p} \qquad (8)$$

since $\tau_1 = R_L C_p$ the Gunn diode junction capacitance is completely determined by the transformed load impedance and the package parasitics $C_p$ and $L_p$. The impedance of the Gunn diode $Z_g$ given by equation (1) can now be calculated by refering to the equivalent circuit. The Gunn diode impedance includes the negative resistance of the diode and the reactance $X_g$ which is determined by the junction capacitance $C_j$ i.e $$\mathcal{I}_m(Z_g) = -\frac{\omega R_L \tau_1}{1+\omega^2 \tau_1^2} \quad (9)$$

Let the reactance of the varactor be $X_v$ where $$X_v = \left(\omega L_V - \frac{1}{\omega C_V}\right) \quad (10)$$

also let $$R_2 = R_L + R_v - \omega \tau_1 X_v \quad (11)$$

and $$X_2 = X_v + \omega \tau_1 R_v \quad (12)$$

It can be shown by using the equivalent circuit that the imaginary part of the transformed impedance $Z_T$ is: i.e.

$$\mathcal{I}_m(Z_T) = \omega L_p + \frac{R_L(R_2 X_V - R_V X_2)}{R_2^2 + X_2^2} \quad (13)$$

The tuning range of the Gunn diode can now be determined by using the first condition of oscillation given by equation (5) along with the expressions for $\mathcal{I}_m(Z_g)$ and $\mathcal{I}_m(Z_T)$ given by equations (9) and (13).

Figure 18:
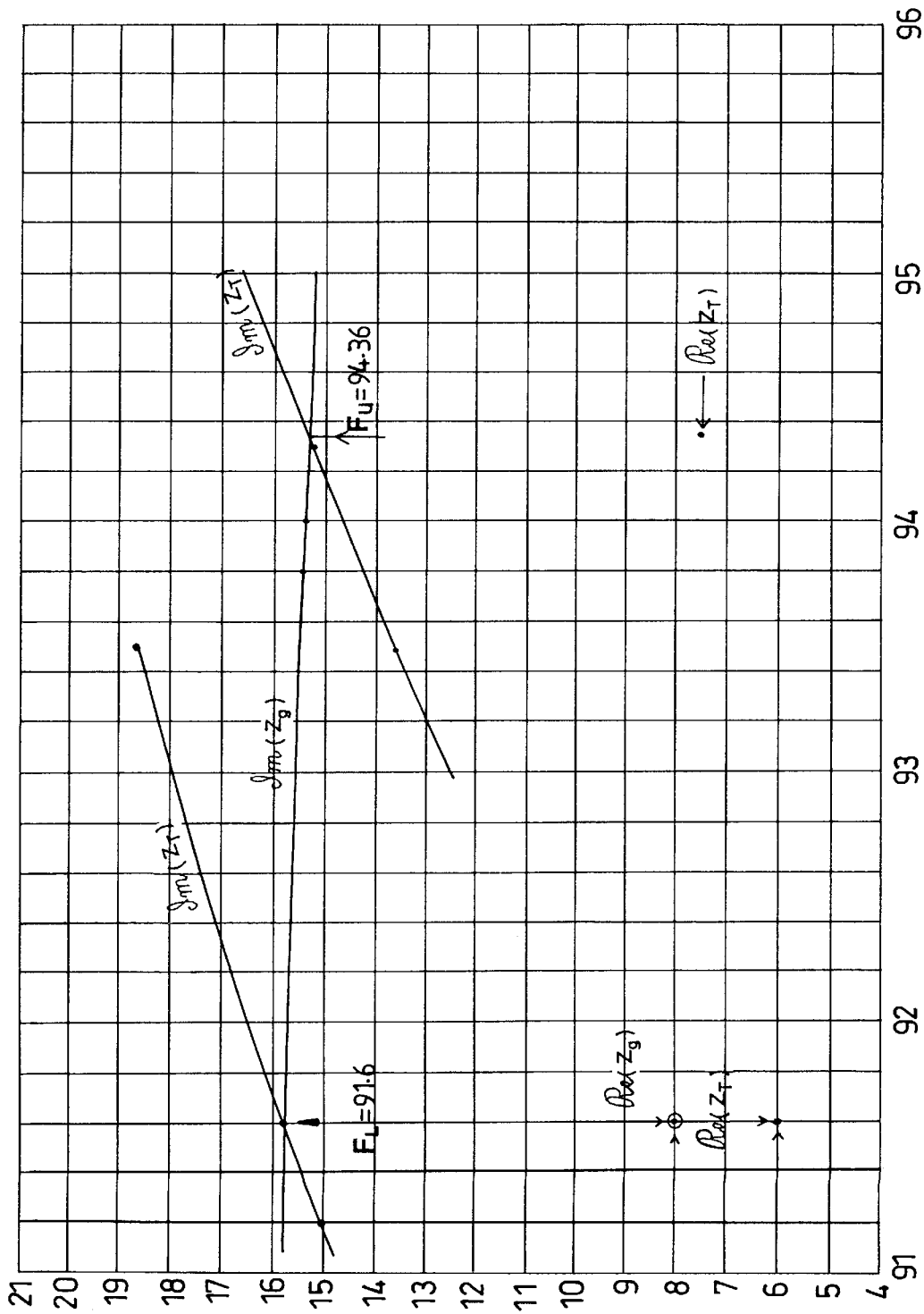
FIG. 18 is a graphical representation of the tuning range of the varactor controlled oscillator circuit.
Figure 19:
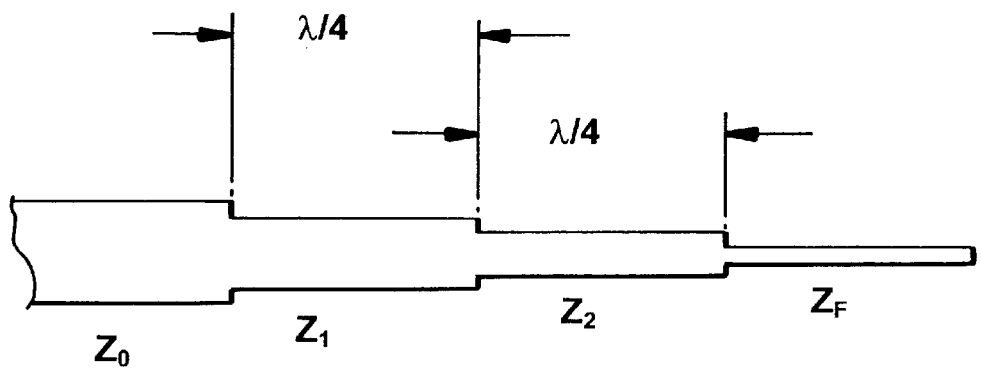
FIG. 19 is a schematic diagram of a microstrip circuit of a two-section transformer component of the varactor controlled oscillator circuit.

As shown in FIG. 18, the tuning range is found by using the following procedure:

(i) Choose a value of $C_v$ which represents a good approximation to its value at the lower limit of the tuning range. Using this value of $C_v$:

(ii) plot $\mathcal{I}_m(Z_g)$ given by equation (9) versus frequency for those frequencies which lie between the lower and upper limits.

(iii) plot $\mathcal{I}_m(Z_T)$ given by equation (13) versus frequency on the same graph for those frequencies which lie below and above the lower limit.

(iv) The value of the frequency at the point of intersection of these two graphs gives the lower limit of the tuning range.

(v) Choose a value of $C_v$ which represents a good approximation to its value at the upper limit of the tuning range.

(vi) Using this value of $C_v$ repeat steps (ii) and (iii) of the above procedure, except that replace "lower limit" with "upper limit" in step (iii).

(vi) The value of the frequency at the point of intersection of the two graphs obtained in step (vi) gives the upper limit of the tuning range.

(vii) The difference between the frequencies obtained in steps (vi) and (iv) yields the tuning range.

Circuit Elements of the Gunn VCO

The tuning range of the Gunn VCO was found from the graphs $\mathcal{I}_m(Z_g)$ and $\mathcal{I}_m(Z_T)$ versus frequency presented in FIG. 8. The graphs were obtained by following the above procedure. The values assigned to the circuit elements were:

$L_p$=0.08 nanoH. $C_p$=0.11 pF $R_v$=2.3 ohms $L_v$=0.08 nanoH $C_v$=0.12 pF (Lower limit of tuning range) $C_v$=0.086 pF (Upper limit of tuning range)

The Gunn diode negative resistance: $-R$=$-8$ ohms

The points of intersection of the lower and upper limits of the tuning range are (91.6 GHz, 15.7 ohms), and (94.36 Ghz, 15.25 ohms) respectively.

This yields a tuning range of 2.76 GHz.

The resistances $\mathcal{R}(Z_g)$ and $\mathcal{R}(Z_T)$ have been plotted on the graph in FIG. 8 to show that the condition $\mathcal{R}(Z_g) > \mathcal{R}(Z_T)$ (7) is satisfied. Note that $\mathcal{R}(Z_T)$=6 and 7.5 ohms at 91.6 and 94.35 GHz respectively, since $\mathcal{R}(Z_g)$=8 ohms equation (7) is satisfied.

A two section transformer 174 is inserted between $Z_L$ and $Z_g$ to provide impedance matching between $R_L$ and $Z_o$. The conditions for oscillation are:

(i) the real part of the Gunn device impedance must be greater than the transformed load impedance, given by equation (7), and (ii) that the imaginary part of the device impedance must be a conjugate match to that of the transformed load impedance.

The two section transformer 174 that matches the transformed impedance $R_L$=250 ohms to $Z_o$=50 ohms is shown in FIG. 6a and in greater detail in FIG. 9. The impedance $Z_F$=$R_L$, $Z_2$=139 ohms and $Z_1$=77.15 ohms.

Line Widths

The linewidths can be estimated to within 1% by using the the following formula for the ratio $\rho = W/h$ for narrow strips {i.e. when $Z_o > (44-2\epsilon_R)$ ohms}:

$$\rho = \frac{8 \exp(H')}{\exp(2H') - 2} \quad (14)$$

$$H' = \frac{Z_o[2(\epsilon_R + 1)]^{1/2}}{119.2} + \frac{1}{2}\zeta\xi \quad (15)$$

where $$\zeta = \frac{\epsilon_R - 1}{\epsilon_R + 1} \quad (16)$$

W is the linewidth and h is the thickness.

TABLE 1

Linewidths of the Two Section Transformer

| $\epsilon_R$ | h mm | W mm | $\rho$ |
|---|---|---|---|
| $Z_2$ = 139 ohms | | | |
| RT Duroid 5880 2.2 | 0.127 | .04826 | .38 |
|  | 0.254 | .09652 | |
| Quartz 4.5 | 0.12 | .017583 | 0.1465 |
|  | 0.35 | .051275 | |
| $Z_1$ = 77.15 ohms | | | |
| RT Duroid 5880 2.2 | 0.127 | 0.2032 | 1.6 |
|  | 0.254 | 0.38 | |
| Quartz 4.5 | 0.35 | 0.2843 | 0.8122 |

TABLE 2

Linewidths of 50 ohm lines.
$Z_0 = 50$ ohms

|  | $\epsilon_R$ | h mm | W mm | ρ |
|---|---|---|---|---|
| RT Duroid 5880 | 2.2 | 0.127 | 0.3978 | 3.132 |
|  |  | 0.254 | 0.7956 |  |
| Quartz | 4.5 | 0.35 | 0.658 | 1.88 |

The linewidths W are given for two separate thicknesses for RT Duroid 5880 when $Z_2=139$ ohms and again when $Z_1=77.15$ ohms. The linewidths are also given for Quartz for two separate thicknesses when $Z_2=139$ ohms but for only one value when $Z_1=77.15$ ohms. The VSWR for a particular bandwidth is given on page 267 in Microwave Filters, Impedance Matching Networks and Coupling Structures by Matthaei, Young and Jones. For this case:

VSWR=1.8, Impedance ratio: 5, Bandwidth=1.0

The linewidths of 50 ohm lines are given in Table 2.

Figure 13:
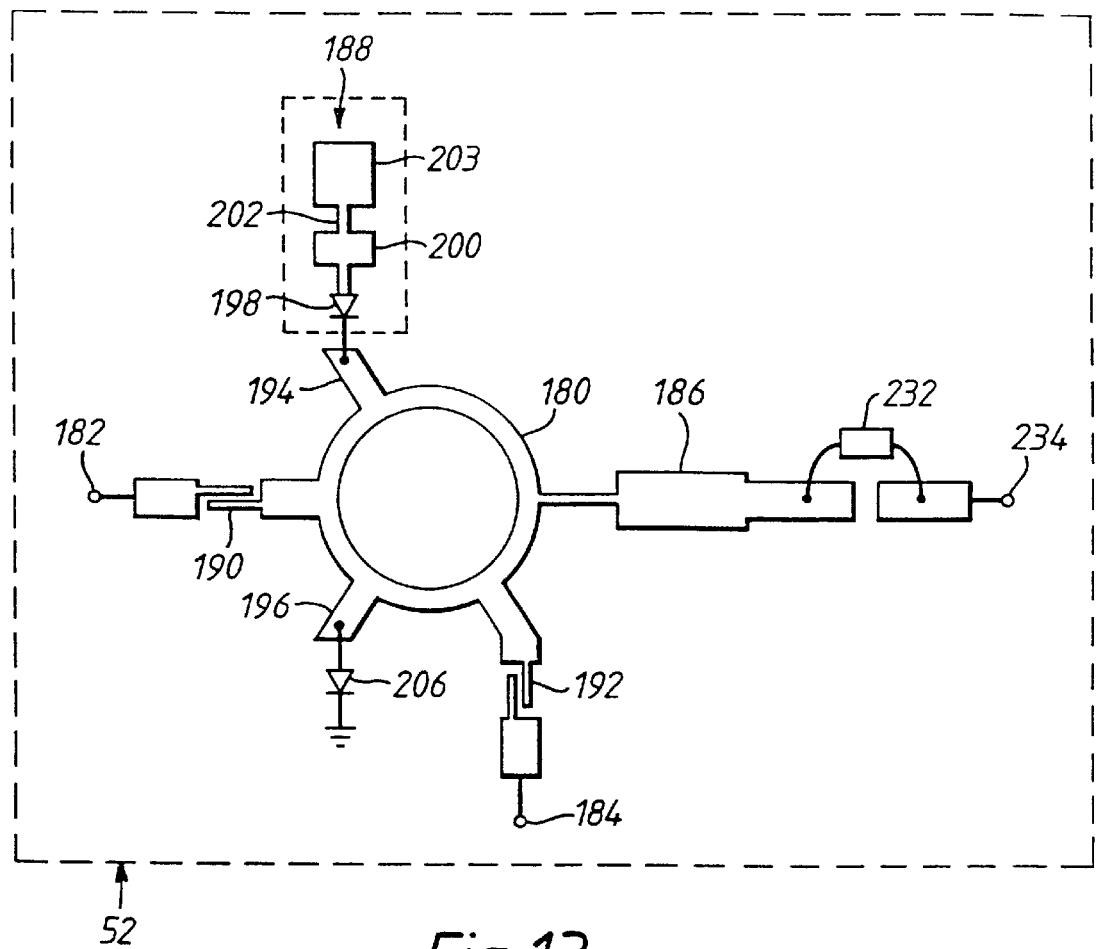
FIG. 13 is a schematic diagram of a microstrip circuit of a radio-frequency hybrid ring mixer component of the radar system shown in FIG. 1.

Turning now to the receiver section of the SMART system 22, FIG. 13 shows the circuit configuration of the hybrid ring mixer 52 in more detail. Ring mixer 52 is a microstrip hybrid ring (ratrace) mixer with a DC bias, fabricated on an alumina substrate having a thickness of 0.38 mm and a dielectric constant of 9.6. The main circuit components of the ring mixer 52 comprise a ring 180 of 70 ohms impedance, which has a sigma port 182 and a delta port 184, a low-pass filter 186 and a bias network 188. During operation of the SMART system 22, the radio-frequency signal received by the ring mixer 52 via line 49 (see FIG. 1) enters the ring 180 via the sigma port 182, passing through a low-frequency block 190 in the process. The delta port 184 receives the local oscillator signal on line 51 (see FIG. 1) and that signal enters the ring 180 through a low-frequency block 192. The low-frequency blocks 190 and 192 are used to prevent any shorting of the intermediate frequency or DC bias in the ring through ports 182 and 184. The ring 180 includes stubs 194 and 196, each having an impedance of 50 ohms. The bias network 188 is connected to the stub 194, and comprises a diode 198, a capacitor 200, an inductance 202, and a capacitor 203. DC bias is supplied to the ring 180 through this bias network 188. Stub 196 is grounded through a diode 206.

Figure 14:
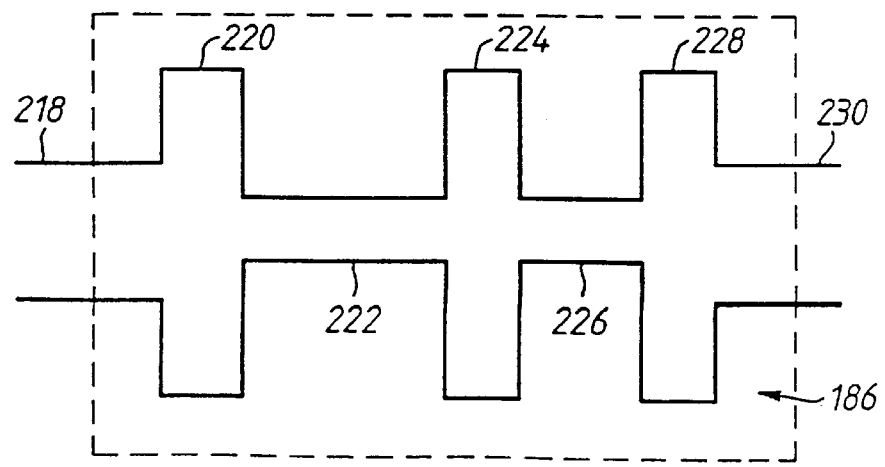
FIG. 14 is a schematic diagram of a microstrip circuit of a low-pass filter component of the radar system shown in FIG. 1.

The intermediate frequency signal generated in the ring mixer 52 leaves the mixer through the low-pass filter 186, the circuit configuration of which filter is disclosed in more detail in FIG. 14. As can be seen in FIG. 14, the intermediate frequency signal enters the low-pass filter 186 via a 50 ohm input line 218, and passes into a circuit layout comprising a capacitor element 220, an inductance element 222, a capacitor element 224, an inductance element 226 and a capacitor element 228, and the leaves by a 50 ohm output line 230. The capacitor elements 220, 224 and 228 have respective values of 0.0829 pF, 0.073 pF and 0.0734 pF, and the inductance elements 222 and 226 have respective values of 0.416 nH and 0.2604 nH. The output line from the ring mixer 52 also includes an intermediate frequency bypass capacitor 232 and an output port 234 (see FIG. 13).

Operation of the Radar System

The operation of the radar system of the preferred embodiment of the present invention will now be described with reference to FIGS. 15 and 16 of the accompanying drawings.

Figure 15:
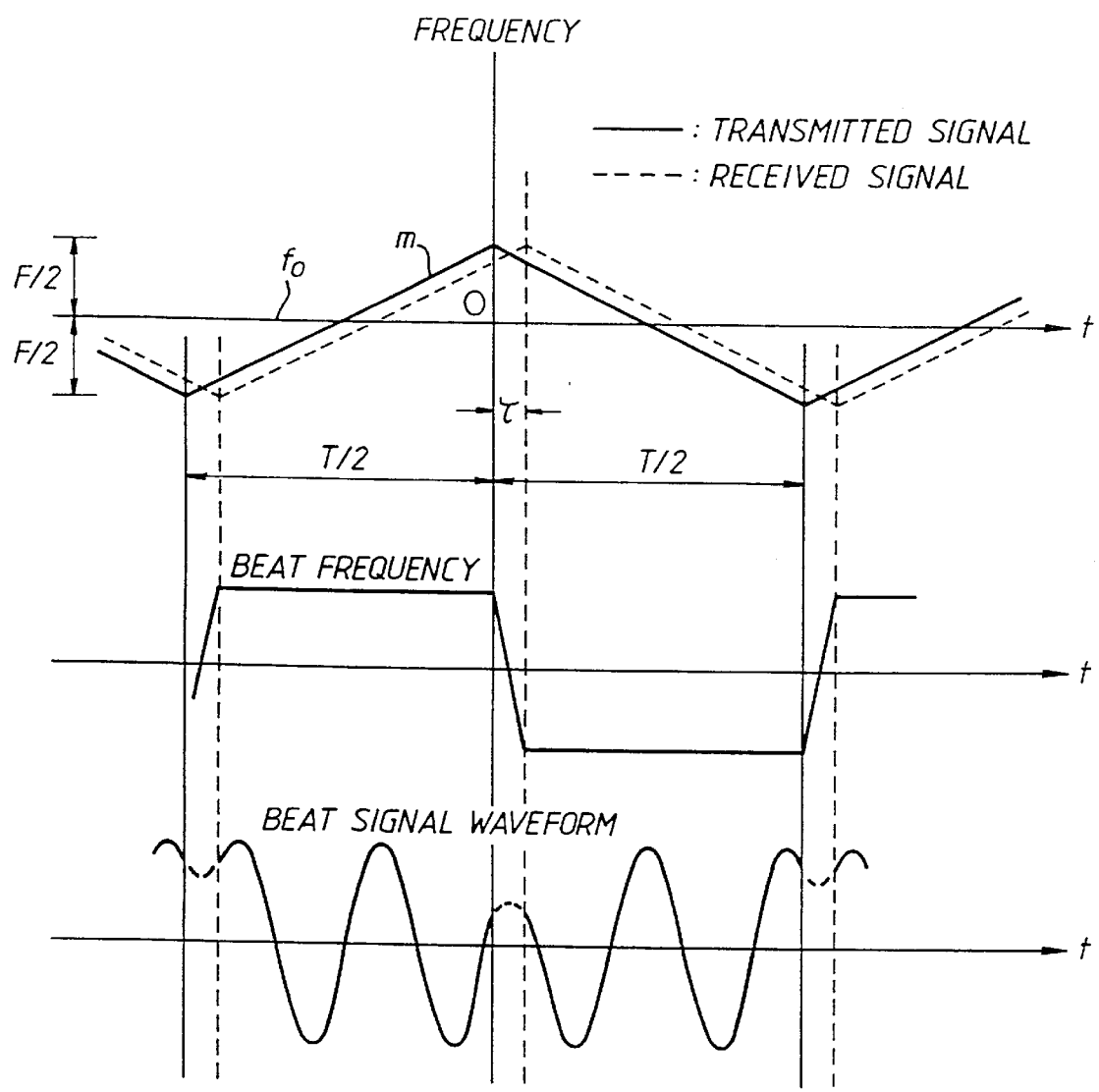
FIG. 15 is a schematic diagram of the wave forms of the transmitted, received and beat frequencies generated during operation of the radar system shown in FIG. 1.

The transmitted, received and intermediate frequencies produced during the operation of the radar system are shown graphically in FIG. 15. In FIG. 15, the carrier frequency is shown as $f_0$, the time as t, the maximum frequency deviation as F, the modulation period as T, and the round-trip time for the transmitted signal to reach an object and to return to the receive antenna is shown as τ. The round-trip time τ taken for the signal to traverse a distance R to a detected object and to return will be 2 R/c, where c represents the velocity of light.

The transmitted signal ($T_x$) shown as a solid line curve in the upper portion of FIG. 15 is the frequency-modulated output of the VCO 34 produced as a result of applying a saw-tooth voltage signal from the linear ramp generator 48 to the input of the summing amplifier 46 (see FIG. 1). The received signal ($R_x$) shown as a broken line in the upper portion of FIG. 15 is separated from the transmitted signal by the round-trip time τ. The beat frequency (B) curve shown in the mid-portion of FIG. 15 is the intermediate frequency output of the hybrid ring mixer 52.

The slope of the transmitted signal, labelled as m, is a key parameter in the operation of the system. If one considers the increasing portion of the ramped transmitted signal, the slope m of the curve is given by the expression:

m=B/Displacement between $T_x$ and $R_x$, but τ=the displacement between $T_x$ and $R_x$, therefore:

$$m=B/\tau \qquad (1).$$

But the slope m is also given by the expression:

$$m=F/(T/2)=2F/T \qquad (2).$$

Equating these two values of the slope to each other and then solving for τ yields:

$$\tau=TB/2F \qquad (3).$$

Substituting τ=2R/c into equation (3) and solving for R yields:

$$R=TBc/4F \qquad (4).$$

This equation shows that, if parameters T and F are known, then the measurement of the beat frequency B enables the range R of a detected object to be obtained.

Two cases must be considered which affect the beat frequency that is measured. The first case (case 1) is that of detecting stationary objects, and the second case (case 2) is that of detecting moving objects.

Considering now case 1, if the object is stationary then it cannot produce a Doppler shift in the received signal. Consequently the beat frequency obtained must be derived solely from the distance of the detected object from the SMART system, i.e. the delay between $T_x$ and $R_x$. Thus the beat frequency for the increasing portion of these signals is equal and opposite to the decreasing portion of the signals. This is the situation shown graphically in FIG. 15, and the beat frequency detected in case 1 will be referred to hereinafter as $B_r$.

Case 2 involves also the consideration of a Doppler frequency $F_d$ produced as a result of the movement of the detected object. If the detected object is moving towards the SMART system, then the beat frequency detected will be reduced by the Doppler frequency $F_d$. If the beat frequency measured on the increasing portion of the signal is designated as $B_{up}$, then:

$$B_{up}=B_r-F_d \qquad (5).$$

If the beat frequency measured on the decreasing portion of the signal is designated as $B_{down}$, then this frequency will be increased by the Doppler frequency $F_d$. Accordingly:

$$B_{down}=B_r+F_d \qquad (6).$$

The information on the range of the detected object from the SMART system can now be obtained by averaging the beats over the cycle, i.e., $$B_r=(B_{up}+B_{down})/2 \qquad (7).$$

The information on the velocity of the detected object relative to the SMART system can now be obtained by subtracting the beats in the decreasing portion of the signal from those in the increasing portion of the signal, i.e., $$F_d=(B_{down}-B_{up})/2 \qquad (8).$$

The various measurements are obtained using digital techniques, after converting the signals from analogue signals to digital signals in the ADC 58, and then processing the digital signals in the signal processing unit 60 (see FIG. 1). The signal processing unit 60 used may be one of a number of commercially-available signal processing units which can derive the desired information from the digital signals in the output from the ADC 58. Consequently, there is no need to disclose a specific circuit configuration for the signal processing unit 60.

The procedure for calculating the beat frequencies, and hence the range and velocity of the object detected by the SMART system, will now be described. The beat frequency signal is shaped into a rectangular wave form, as shown in FIG. 15. The zero-crossing rate is measured when the beat frequency slope is positive, i.e. it is counted once per modulation period T. An alternative method is to count the zero-crossing rate when the beat frequency slope is positive and when the beat frequency slope is negative, i.e. twice during half a modulation period. The maximum error E in a range measurement is then half the wavelength of the beat signal, i.e., $$E=c/4F \qquad (9).$$

If the maximum frequency deviation is taken as 300 MHz, then the maximum error E is 25 cm. This error, which is inherent in frequency counting, is termed the step error. This error could be reduced by increasing F.

The Doppler frequency $F_d$ is a function of the wavelength $\lambda$ of the carrier frequency $f_0$ and the velocity V of the object detected relative to the user of the SMART system, as follows:

$$F_d=2V/\lambda \qquad (10).$$

Substituting $B_r$ for B in equation (4) yields:

$$R=TB_r c/4F \qquad (11).$$

When, for example, the object detected is at a range of 2 meters from the SMART system, the beat frequency $B_r$, which can be derived directly from equation (11), has a value of 2 KHz when T=0.004 seconds, F=300 MHz and $c=3\times10^{10}$ cm/sec. The wavelength $\lambda_0$ of the carrier signal, from the equation $\lambda_0=c/f_0$, is 3.19 mm. If the velocity V of the object detected relative to the SMART system is 1 meter/second, then the substitution of these values into equation (10) yields a value for the Doppler frequency $F_d$ of 2 KHz. The intermediate frequency signal may be mixed down by the signal processing unit 60 to obtain an audio output, both $B_r$ and $F_d$ lying in the lower portion of the audio range detectable by a user of the SMART system.

Figure 16:
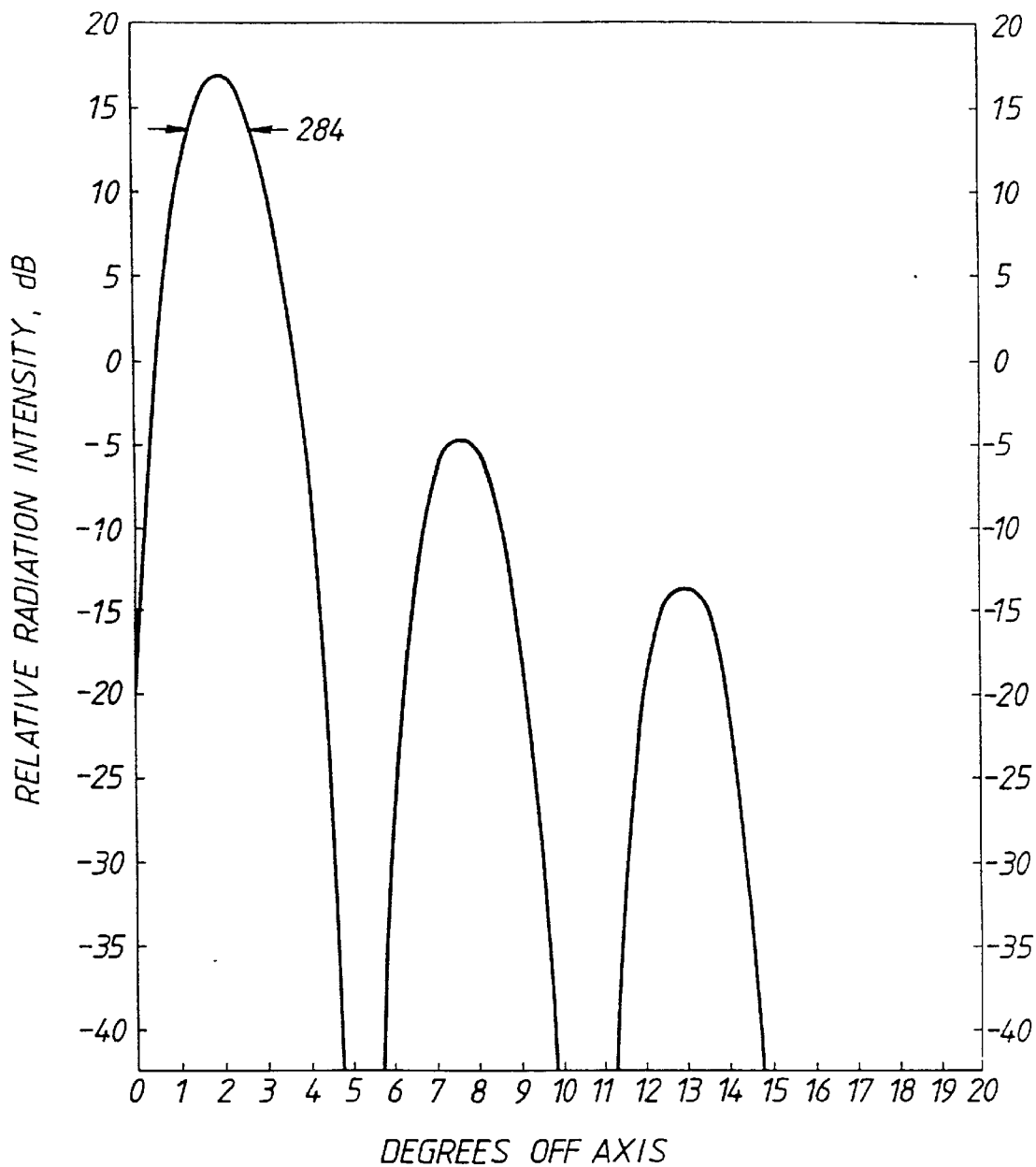
FIG. 16 is a graphical representation of the radiation pattern generated at the planar phased array shown in FIG. 7.

Referring now to FIG. 16, this shows the radiation pattern produced by the planar phased array shown in FIG. 7. Reference numeral 284 indicates the half-power or 3 dB points for the radiation pattern, showing that the planar phased array used for both the transmit antenna 30 and the receive antenna 32 has a beam width of 1.43 degrees. This is a very narrow beam width, similar to that of a pencil beam, and helps the SMART system to readily distinguish one object from another when the radiation pattern from the transmit antenna 30 is used to scan the environment in front of the system.

The slope m of the transmitted signal must be constant in order for equation (3) to be valid. That is to say, equation (1) is only equal to equation (2) for a constant slope m. Varactor-tuned Gunn oscillators have variations in the tuning slopes thereof which can amount to 40% to 50%. Thus the tuneable oscillator 34 of the SMART system of the present invention must be stabilised in order to obtain correct range and velocity information from the system. This is accomplished by using feedback with the linear frequency discriminator 44 in the feedback loop comprising the circuit elements 34, 36, 38, 40, 42, 44 and 46 shown in FIG. 1.

Referring now to FIG. 11c, in particular to the linear portion of the curve of the output signal that occurs between the trough 214 and the peak 216, this graph has a scale of 10 MHz/division for the frequency and 5 mv/division for the output signal voltage. Thus the linear region of the curve between the trough 214 and the peak 216 has a slope of 0.5 mv/MHz, and represents the sensitivity of the linear frequency discriminator 44. If each one of the matching networks 144, 146, 152 and 154 has a gain of 5, then the path from the power splitter 142 to the signal output 160 via either resonator 148 or resonator 150 has an overall gain of 25. This produces a sensitivity of 12.5 mv/MHz for the discriminator 44. The matching networks 144, 146, 152 and 154 can be formed from FETs (Field Effect Transistors) which can incorporate the necessary gain.

The sub harmonic mixer 38 shown in FIG. 10 has a conversion loss of 20 dB. The amplifier 42 in FIG. 1 has a gain of 43 dB, giving an overall loop gain of 200, or 23 dB. The discriminator sensitivity of 12.5 mv/MHz plus the closed loop gain of 200 produces a 0.5% variation in linearity, which is more than adequate for a constant slope m. The accepted value for the variation from linearity is 1%.

The SMART system parameters for the preferred embodiment of the present invention are as follows:

Transmitter power:

| | |
|---|---|
| Vehicle collision avoidance SMART systems: | 1–5 milliwatts, |
| Short range systems: | 1 microwatt. |
| Carrier signal frequency: | 94 GHz |
| Modulating frequency: | 250 Hz |
| Maximum modulation frequency excursion: | 300 MHz |
| Closed loop local oscillator frequency: | 23.25 GHz |
| Sub harmonic (N=4) mixer conversion loss: | 20 dB |
| Closed loop intermediate frequency: | 1 GHz |
| Closed loop amplifier gain: | 3 dB |
| Linear frequency discriminator sensitivity: | 12.5 mv/MHz |
| Antenna gain: | 16.8 dB |
| Antenna beam width (in degrees): | 1.428 |

| -continued | |
|---|---|
| Receiver hybrid ring mixer conversion loss: | 6 dB |
| Receiver IF amplifier gain: | 30 dB |
| Receiver IF amplifier bandwidth: | 250 MHz |

A SMART system according to the preferred embodiment of the invention, having these parameters, is capable of detecting an object having a radar cross-section of 0.1 m² at a distance of 87 meters with a transmitter power of 1 microwatt. With a transmitter power of 1 milliwatt, the same SMART system is capable of detecting the aforesaid object at a distance of 495 meters.

Millimeter wave radiation is subjected to an attenuation of approximately 3 dB/Km in thick fog, and a transmitter power of 1 milliwatt is therefore preferred for a vehicle collision avoidance system. A short range FMCW radar system according to the present invention provided with a transmitter having a power of 1 milliwatt could be adapted for short range requirements by inserting an attenuator between the transmitter and the antenna of the system. The insertion of an attenuator having 30 dB of attenuation will decrease the output power received by the antenna of the SMART system to 1 microwatt.

The narrow beam width of the transmitted signal from the SMART system of the preferred embodiment of the present invention means that an object that is only 2.5 m wide can be detected by a user of the SMART system at a range of 100 meters. Consequently, the SMART system can distinguish two vehicles side-by-side at a distance of 100 m.

In the preferred embodiment of the present invention, the radar system is divided into two sections, one section dealing with analogue signals, the other dealing with digital signals. The section dealing with the analogue signals comprises the SMART system 22, with all the analogue circuitry being mounted thereon, whilst the section dealing with the digital signals, including the signal processing unit 24 located in the remote unit. The digital circuits used in the signal processing unit 24 produce stray radiation during the operation thereof, as a result of the production of wave forms having fast rise and fall times. Consequently, the physical separation of the radar system into analogue and digital sections provides those sections with radio-frequency isolation from one another, which is an important electromagnetic compatibility feature of this preferred embodiment of the invention.

The fabrication of the SMART system of the preferred embodiment of the present invention involves the use of various dielectric substrates for supporting the antennae, the electronic components, and the transmission lines of the system. Any dielectric substrate having a sufficiently high dielectric constant and sufficient structural strength may be used for this purpose. Thus, for example, suitable dielectric substrates could be formed from polytetrafluoroethylene (dielectric constant of 2.45), quartz (dielectric constant of 4.5), alumina (dielectric constant of 9.6), RT/Duroid 6010 (dielectric constant of 10.3), GaAs (dielectric constant of 12.5), fused silica (dielectric constant of 3.6), beryllia (dielectric constant of 6.5), and sapphire (dielectric constant of 9.3). The planar phased arrays used in the SMART system are preferably made of copper, but any highly electrically-conductive metal or metal alloy can be used, such as gold or silver.

The oscillator circuit may be constructed using either of the following fabrication techniques:

(i) Microstrip construction of the antennas, RF transmission lines, couplers, filters and other passive elements such as capacitors, inductances and resistors, as well as of the DC bias lines, blocks and bypass capacitors. Those circuit elements that are not of microstrip construction will be referred to as devices. These are:
(a) the VCO Gunn diode (166)
(b) the LO Gunn/Impatt diode (108)
(c) the dielectric resonator (104)
(d) the harmonic mixer diodes (128)
(e) the feedback loop amplifier (42)
(f) the Linear Frequency Discriminator diodes (156 & 158)
(g) the summing amplifier (46)
(h) the ring mixer diodes (198 & 206)
(i) the receiver amplifier (56)
(j) the second stage mixer diodes (FIG. 2)

These devices are fabricated separately and are "drop-in" components.

(ii) Microstrip construction for the RF transmission lines, couplers, filters and other passive elements such as capacitors, inductances and resistors that operate at 76.5 GHz or 94 GHz. All elements that operate below 30 GHz are constructed as part of a Monolithic Millimeter Wave Integrated Circuit (MMIC). See "Integriete Mikrowellanschaltungen" (Integrated Microwave Circuits) by R. K. Hoffman, Berlin 1983, which is incorporated by reference.

Thus those devices (b), (c), (e), (f), (i) and (j) in the VCO feedback loop that operate below 30 GHz will make up a single MMIC, while (g) will be a separate MMIC.

A second embodiment of the oscillator circuit will now be described with reference to FIGS. 20 to 22. The oscillator circuit includes a second harmonic oscillator 301, a linear frequency discriminator 302 that operates at frequencies in the J band, i.e. above 500 MHz, and a mixer 303 that is connected to the output of the local oscillator 40 via an input line 304. The discriminator 302 may be constructed from passive microstrip components, i.e. hybrid ring couplers and delay lines. Alternatively, the second stage mixer 303 can be replaced by a detector (for example an envelope detector).

Figure 23:
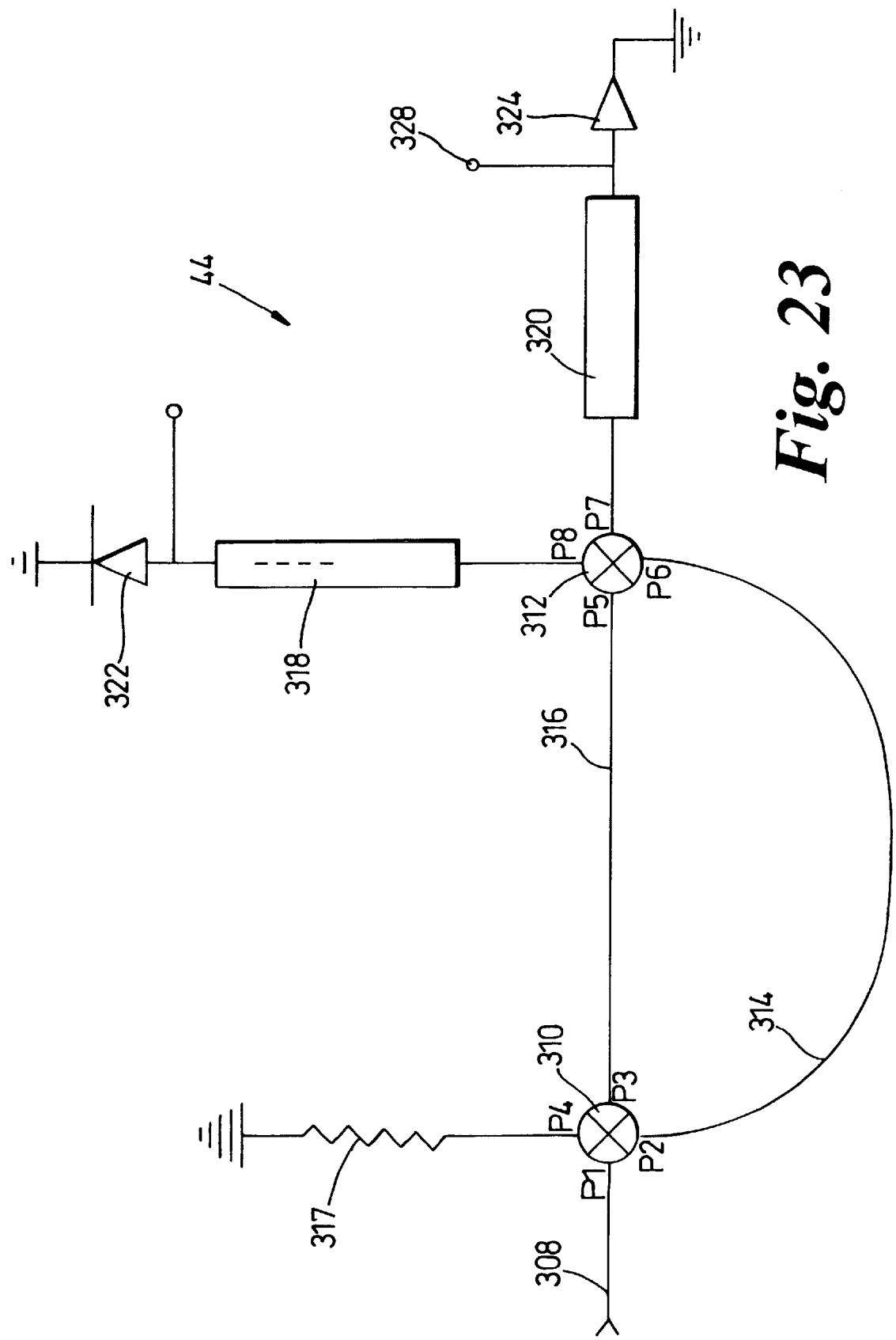
FIG. 23 is a block diagram of a discriminator component of the oscillator circuit.

A block diagram of the linear frequency discriminator 44 is shown in FIG. 23. It consists of the following parts: an input terminal 308; two branch line couplers 310,312; delay and reference paths 314, 316; a microwave load 317; two matching networks 318,320; two output diodes 322,324 and two output terminals 326,328. The output coupler 312 is matched to a diode with nominal parameters. The key parameter is the diode capacitance.

Figure 24:
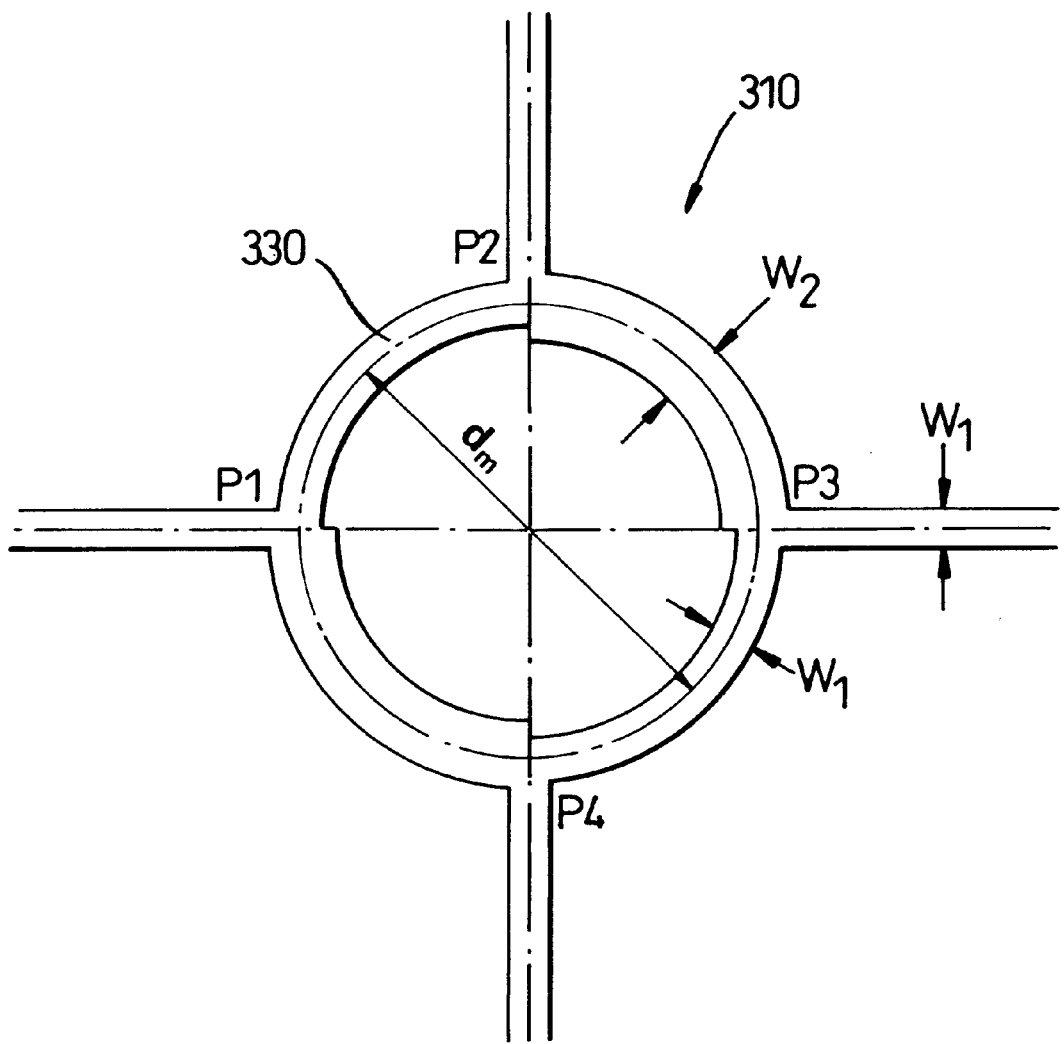
FIG. 24 is a schematic diagram of a microstrip 3 dB Hybrid directional coupler of the discriminator component.

A schematic diagram of a microstrip hybrid-ring directional coupler 310 is shown in FIG. 24 and consists of a ring 330 having four ports labelled P1-P4. The electrical characteristics and the geometrical dimensions of the hybrid-ring directional coupler are as follows:

| Operating frequency $F_o$ | 18 GHz |
|---|---|
| Characteristic Impedance $Z_o$ | 70 Ohms |
| $W_1$ = Width of 70 ohm line | 0.2257 mm |
| $W_2$ = Width of 50 ohm line | 0.3927 mm |
| diameter $d_m$ | 4.0234 mm |
| Substrate | RT Duroid 5880 |
| Dielectric constant | 2.2 |
| Thickness (height) | 0.127 mm |

The phase shifts $\rho_{P1P2}$ between ports P1 and P2 and $\rho_{P1P3}$ between ports P1 & P3 are:

$$\rho_{P1P2}=2\pi(F/F_o)\,(\tfrac{1}{4}) \ \& \ \rho_{P1P3}=2\pi(F/F_o)\,(\tfrac{3}{4})$$

Figure 25:
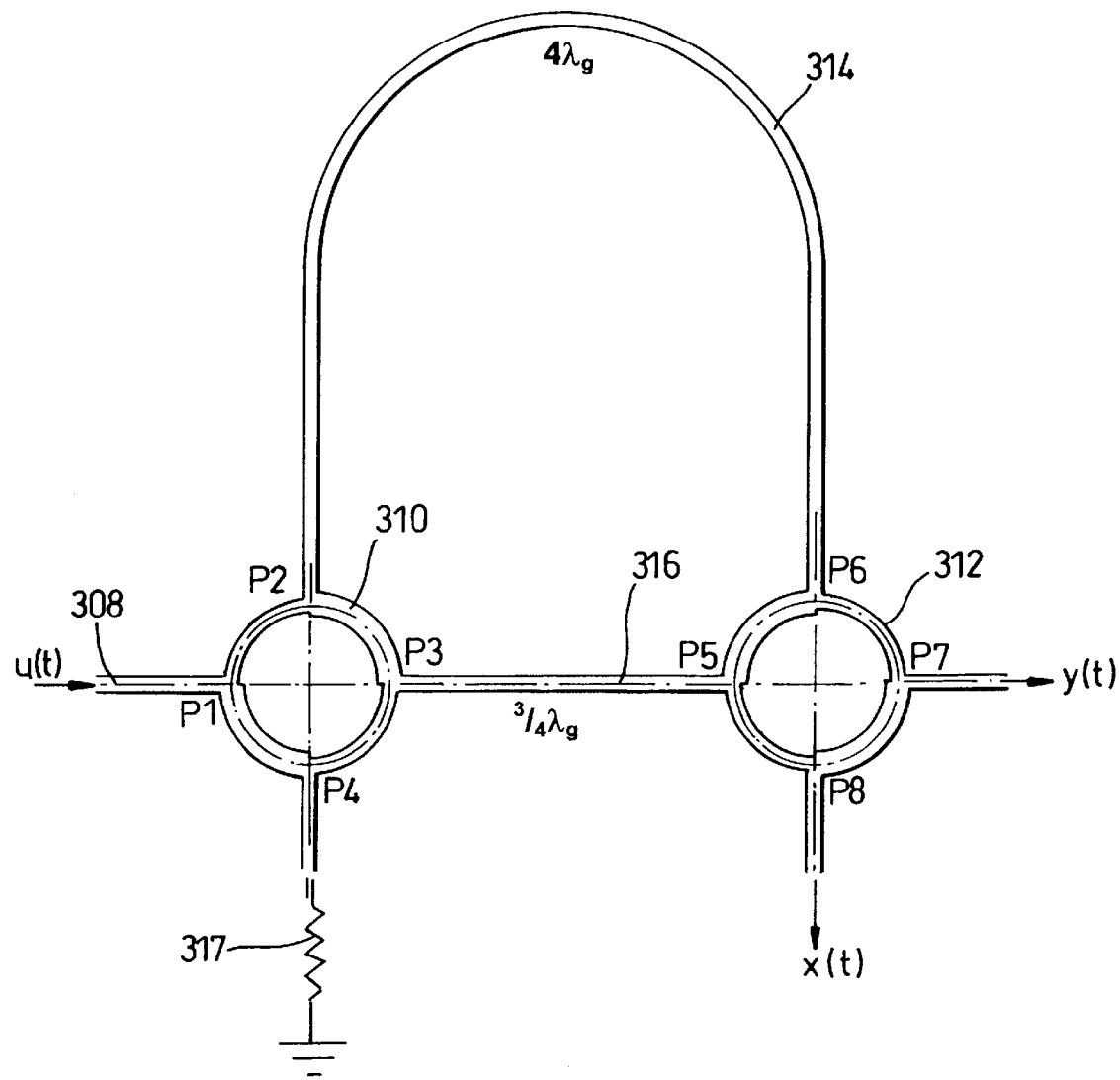
FIG. 25 is a diagram of a part of the discriminator, showing the input and output voltages, phase shifts and the delay and reference attenuation.

$S_{nm}$ is the amplitude split between ports N and M, or the S parameter. Consider a voltage signal u(t)=V cos (2πft) that enters port P1 and exits port P2. Its amplitude on exit is: $VS_{P2P1}$ The second hybrid-ring directional coupler 312 in the discriminator 44 is shown in FIG. 25 with ports labelled P5-P8. Port P2 is connected to port P6 by the delay path 314. If there is no attenuation in the delay path, the signal that exits port P2 with amplitude $VS_{P2P1}$ enters port P6 and then exits port P8 with an amplitude $VS_{P2P1}S_{P8P6}$.

The amplitude splits are a function of a frequency and will be designated as $S_{nm}$ (F) when so required.

The Delay and Reference paths 314,316 are shown in FIG. 25. The phase shift produced by the delay path 314 is $\rho_{P1P3}=2\pi(F/F_0)$ ($^{16}/_4$). It is shown as $4\lambda_g$ in FIG. 15. Similarly the reference path 316 is labelled ($^{3}/_4$)$\lambda_g$.

The attenuation of the delay and reference paths is denoted by $\alpha_d$ and $\alpha_r$ respectively.

The attenuation $\alpha_x$ in any given path x is given by the following expression:

$$\alpha_x = \frac{N_x 27.3 \varepsilon_r (\varepsilon_{\mathit{eff}} - 1) \mathrm{Tan}\delta}{(\varepsilon_{\mathit{eff}})^{1/2}(\varepsilon_r - 1)\lambda_o} \, dB$$

Where: $N_x$ is the number of wavelengths in path x, x=d indicates the delay path, x=r indicates the reference path.

Tanδ is the loss tangent of the substrate material.

$\epsilon_r$ is the relative dielectric constant of the substrate material, $\epsilon_{\mathit{eff}}$ is the effective dielectric constant of the substrate material.

Consider FIG. 25 again. Let a signal enter port P1 with unit amplitude. It will exit port P2 with amplitude $S_{P2P1}$, be attenuated by $\alpha_d$ after traversing the delay path, then it will enter port P6 with amplitude $S_{P2P1}\alpha_d$. Finally it exits port P8 with an amplitude given by:

$C_{P2P8}=S_{P2P1}\alpha_d S_{P8P6}$ and similarly $C_{P3P8}=S_{P3P1}\alpha_r S_{P8P5}$ is the amplitude of the signal that exits port P8 after it enters port P1, exits port P3, traverses the reference path 316, enters port P5 and exits port P8.

The amplitudes of the signals that leave port P7 after traversing the delay and reference paths are:

$C_{P2P7}=S_{P2P1}\alpha_d S_{P7P6}$ and similarly $C_{P3P7}=S_{P3P1}\alpha_r S_{P7P5}$.

Figure 21:
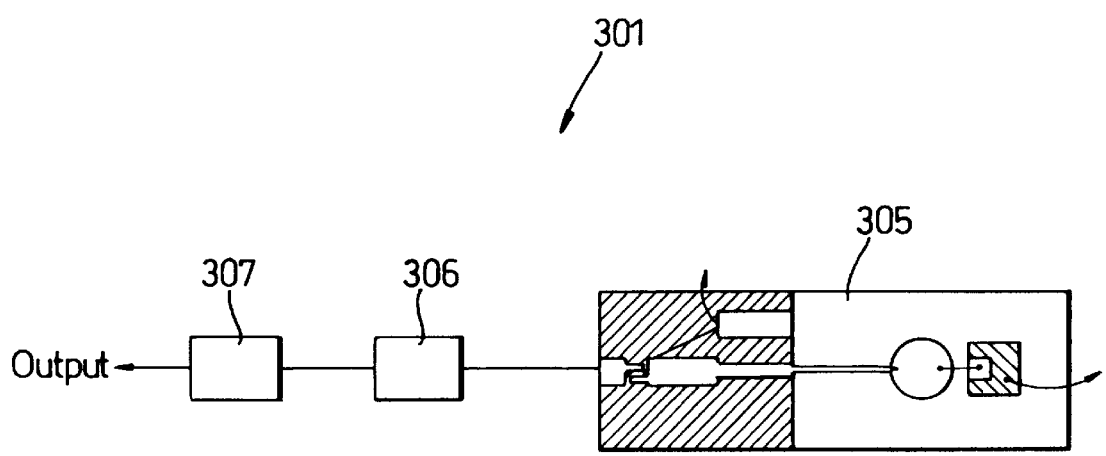
FIG. 21 is a schematic diagram of a second harmonic voltage-controlled oscillator component of the oscillator circuit shown in FIG. 10.

The second harmonic oscillator 301 is shown in detail in FIG. 21 and comprises a planar VCO 305, which is similar to the VCO 34 shown in FIG. 6a, a matching circuit 306 and a band-pass filter 307. The VCO 305 operates at a fundamental frequency of 47 GHz but its output also includes various harmonics of that frequency. The output of the VCO 305 is filtered by the band-pass filter 307, which allows only the second harmonic, at a frequency of 94 GHz, to pass. The output frequency of the second harmonic oscillator 301, comprising the planar VCO 305, the matching circuit 306 and the band-pass filter 307, is therefore 94 GHz.

Figure 22:
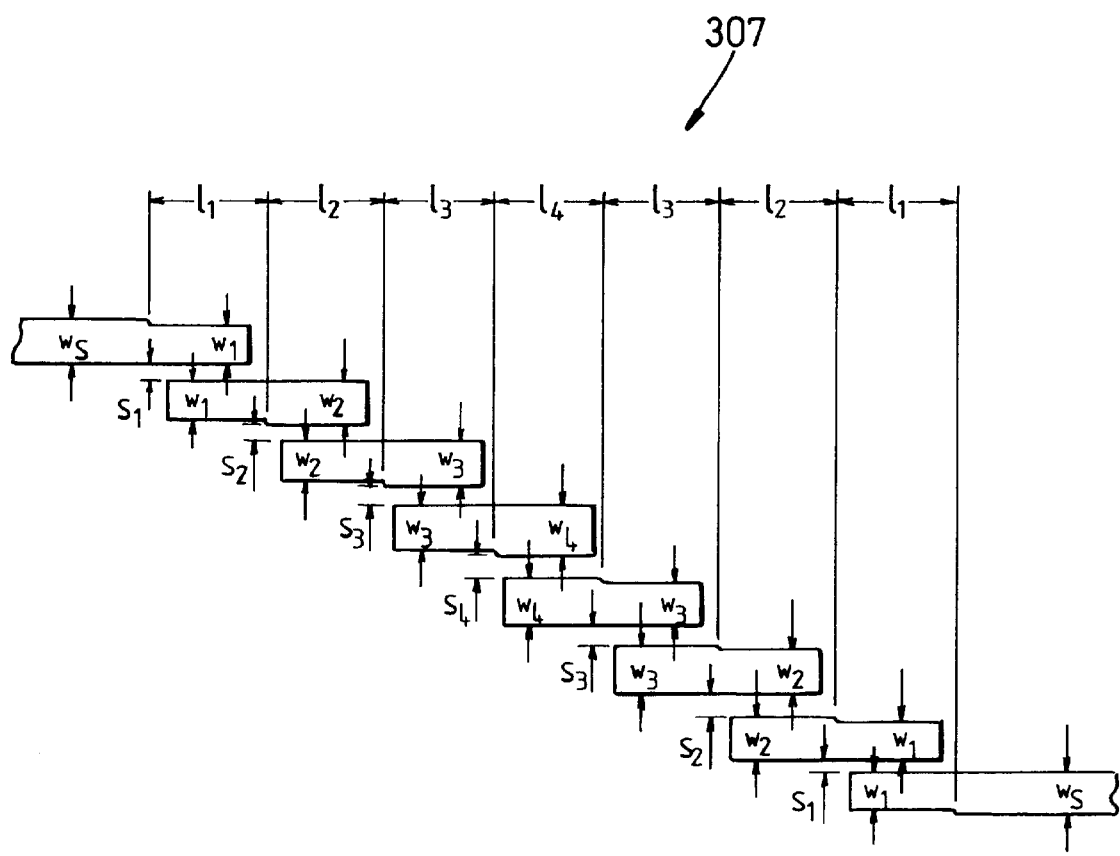
FIG. 22 is a schematic diagram of a microstrip circuit for a seven parallel-coupled band-pass filter component of the oscillator circuit shown in FIG. 10.

The band-pass filter 307 is shown in more detail in FIG. 22 and consists of seven microstrip parallel-coupled resonators. Alternatively, it can be constructed of microstrip resonators that are series-coupled (not shown).

The oscillator circuit shown in FIG. 20 operates as follows. The local oscillator 40 generates an output signal on line 39 at a fixed frequency of 19 GHz. This signal is multiplied by the harmonic mixer 38 up to a frequency of 76 GHz and combined with the 94 GHz signal supplied through line 37 from the coupler 36 to generate a first intermediate signal at the beat frequency of 18 GHz. This signal is fed via the amplifier 42 to the discriminator 302. The output of the discriminator 302 is connected to one input of the mixer 303 (which may be a single ended or double balanced mixer), which combines that signal with the 19 GHz output signal of the local oscillator 40 to produce a second intermediate frequency output signal at the beat frequency of 1 GHz. This signal is fed into one input of the summing amplifier 46 through output line 45 and serves to correct non-linearities and temperature drift in the output of the second harmonic oscillator 301.

The tuning range of the second harmonic oscillator 301 can be determined by modifying the procedure outlined above at page 12, line 30 to page 13, line 15 in the following manner. If the output frequency of the band pass filter 307 is $F_0$, the central frequency of the tuning range will be ($F_0/2$). In other words, the fundamental frequency will be the central frequency of the tuning range and the output frequency will be the second harmonic.

Figure 20:
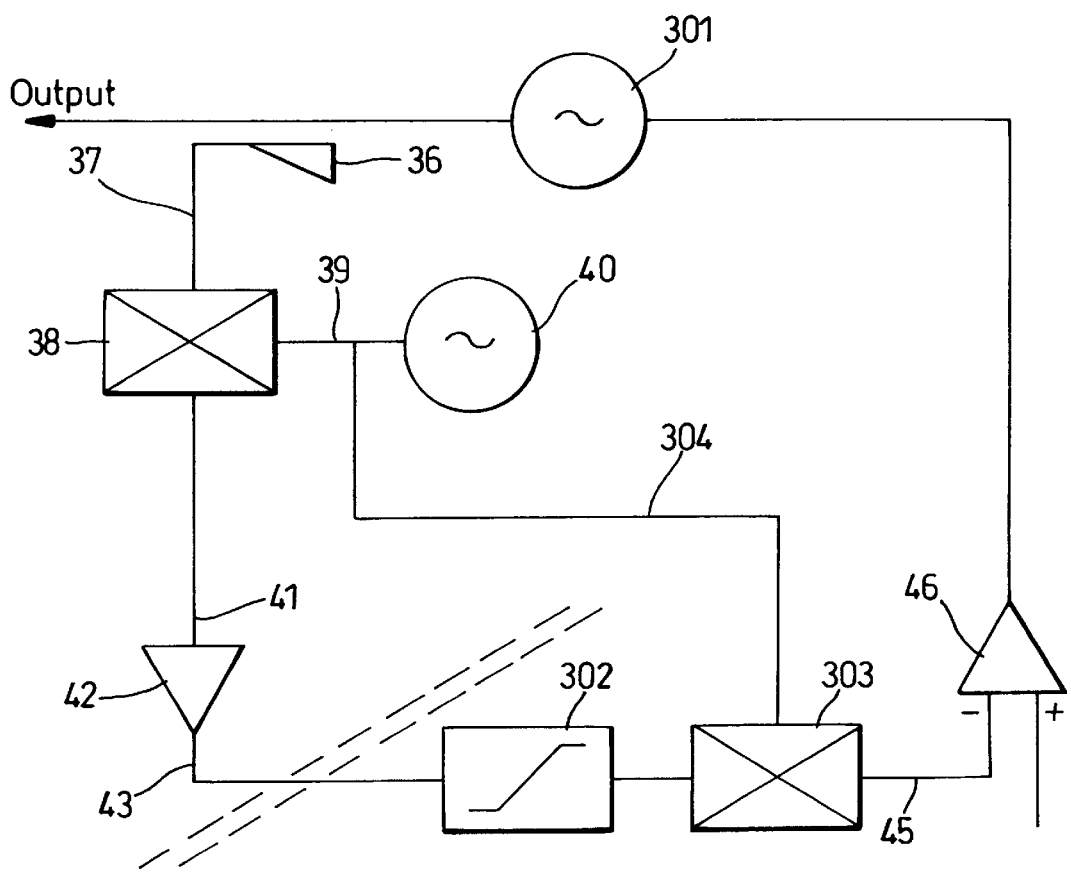
FIG. 20 is a schematic circuit drawing of a voltage controlled oscillator circuit according to a further embodiment of the present invention.

The principle of operation of the closed loop feedback circuit shown in FIG. 20 is based on the fact that the linearity of delay line discriminators is dependent on the frequency of operation. The higher the frequency of these discriminators, the greater the linearity. Therefore, if the second harmonic oscillator 301 and the local oscillator 40 have frequencies of 94 GHz and 19 GHz respectively, the fourth harmonic mixer 38 will produce an intermediate frequency (IF) of 18 GHz which is fed into the delay line discriminator 302. The IF of 18 GHz will produce a deviation from linearity of less than 2% over a 300 MHz bandwidth, and the higher the IF, the smaller the deviation from linearity will be.

The closed loop feedback circuit shown in FIGS. 20 to 22 may be modified to include a harmonic oscillator that uses a higher harmonic by selecting an appropriate VCO 305 and band pass filter 307. For example, in a circuit that uses the $n^{th}$ harmonic, the central frequency of the tuning range will be ($F_0/n$).

Figure 5:
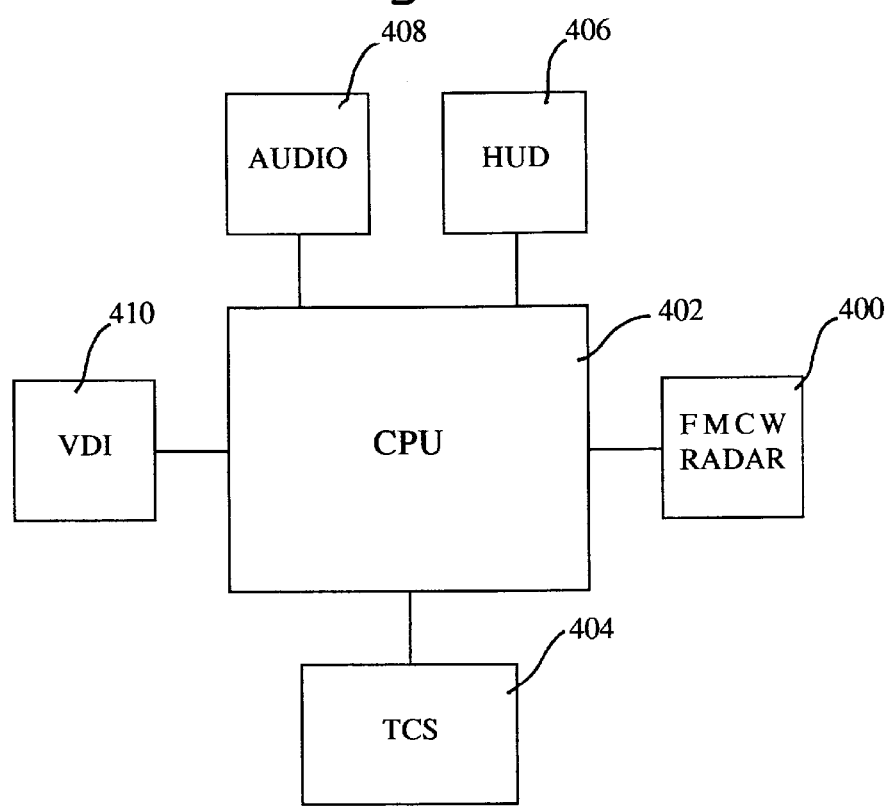
FIG. 5 is a schematic diagram of a vehicle collision warning system that includes a radar system as shown in FIG. 1.

FIG. 5 shows schematically the main components of a vehicle collision avoidance system that includes the radar system shown in FIG. 1. The collision avoidance system includes a forward-facing FMCW radar 400 mounted at the front of the vehicle, a central processor unit (CPU) 402, a traction control system (TCS) 404, a visual display unit 406, preferably in the form of a head-up display (HUD), an audible warning system 408 and a vehicle data interface (VDI) 410.

The radar antennae may be mounted on any part of a vehicle bumper, for example on the front, sides or rear. They may operate as independent transceivers or alternatively, in order to detect small targets (for example, motor cycles, lamp posts etc.), they can be connected together to form an interferometer. Many types of interferometer may be used, including phase-switched (multiplying), multi-element, grating, compound and cross arrays, and phase-closure and self-calibration techniques may be used, as discussed by Kraus. See J. D. Kraus, Radio Astronomy, 2d ed., Cygnus-Quasar 1986, Chapter 6, which is incorporated by reference.

The forward facing radar 400 measures and reports the position and relative velocity of any objects in front of the vehicle. This information is transmitted to the central processor unit 402 and combined with data from the vehicle data interface relating to, for example, the vehicle's speed, gear position, throttle and brake status and steering angle. The central processor unit 402 assesses whether any of the objects are in the vehicle's path and identifies any threatened collisions. If a possible collision is identified, the system may either provide a warning by means of the visual display unit 406 and/or the audible warning system 408, or it may take control of the vehicle by means of the traction control system 404, for example by applying the brakes, to reduce the risk or severity of a collision. The operation of various vehicle collision avoidance systems is described in more detail in patent applications Nos. GB 2262829A, GB 2266803A and EP 0605104 A1, and U.S. Pat. No. 5,289,182, the contents of which are incorporated by reference herein.

Industrial Applicability

The present invention provides a lightweight, miniaturised radar system that operates with millimeter wavelength radiation having an operating frequency lying between 35 and 220 GHz, which radiation has an attenuation of only approximately 3 dB/km in thick fog, and which can also penetrate smoke, dust and flame without undue attenuation.

The system can be used as part of a vehicle collision avoidance or warning system, in a cruise control system or air bag deployment system. Other possible applications of the system include altimeter systems, security systems, robotic control systems, unmanned planetary exploration vehicles, toys.

Preferably the radar system of the present invention includes an analogue section and a digital section including signal processing circuitry, audio interface and power supplies which is provided in a remote unit.

The radar system uses narrow beams of radiation, which is a desirable feature for producing accurate detection and recognition of objects sensed by the system. The SMART system produces such narrow beams of radiation by the use of the planar phased arrays which form the transmit antenna and the receive antenna of the system, the beam width of the radiation being determined by the number of elements present in the array.

The SMART system of the preferred embodiment of the invention achieves the desired lightness and compactness by using microstrip fabrication techniques to form the transmission lines and passive components for the radio-frequency and intermediate frequency portions of the circuitry, and by using thick film hybrid techniques to form the low frequency components of the circuitry. There is no necessity to include any form of wave guides in the SMART system, as is the situation with conventional radar systems.

In the SMART system of the preferred embodiment of the present invention, the transmitter with the electronic components of the closed frequency loop, including the local oscillator stabilised by the dielectric resonator is physically separate from the electronic components of the receiver. This arrangement provides radio-frequency isolation between all the active devices of the system. It may also be desirable to provide the circuits of the system with metal coverings for protection against external radio-frequency interference.

A radar system according to the present invention detects both stationary and moving objects by a phase-shift radar system, which is either arranged to count the frequency of the phase change between a transmitted signal and a received signal, or is arranged to measure the actual change in phase between a transmitted signal and a received signal. In the preferred embodiment of the present invention, the frequency of the phase change between a transmitted signal and received signal is counted, since this is relatively cheap to accomplish, and has low power consumption requirements, both of which are important factors in the overall commercial design of the present invention.

What is claimed is:

1. A frequency modulated continuous wave (FMCW) phase shift radar system that is capable of detecting both stationary and moving objects, said radar system including:

a transmitter and a receiver:

a linearly-tuned oscillator circuit arranged in said transmitter as a source of said electromagnetic radiation, said linearly-tuned oscillator circuit including a voltage controlled oscillator (VCO) and a closed loop feedback circuit comprising a local oscillator, a harmonic mixer coupled to receive a stabilized local oscillator (LO) frequency signal from said local oscillator, and a radio frequency (RF) signal from an output of the VCO, said harmonic mixer being arranged to mix said LO frequency signal with said RF signal to obtain an intermediate frequency (IF) signal, and a linear frequency discriminator coupled to receive said IF signal and arranged to produce an output voltage signal that is directed to an input of the VCO for stabilizing the VCO;

a signal processing unit coupled to an output of said receiver for computing a relative range and velocity of an object detected by the system; and a miniaturized front end assembly constructed and arranged to produce millimeter wavelength electromagnetic radiation, said front end assembly including a planar phased array having substantially narrow beamwidth characteristics, and a planar circuit including said VCO, said local oscillator, and said harmonic mixer.

2. A radar system according to claim 1, wherein each of the VCO, the local oscillator, and the harmonic mixer are planar components arranged to operate in the absence of waveguide coupling.

3. A radar system according to claim 1, wherein said local oscillator includes a dielectric resonator, a Gunn/Impatt diode, and a low-pass filter.

4. A radar system according to claim 3, wherein said low-pass filter comprises an array of microstrip capacitor and inductance elements.

5. A radar system according to claim 1, wherein said VCO is a planar component arranged to operate in the absence of waveguide coupling, and includes a varactor, a Gunn diode that is operatively controlled by said varactor, and an impedance matching device configured to match impedances of the varactor and the Gunn diode.

6. A radar system according to claim 5, wherein said impedance matching device is a two-section transformer.

7. A radar system according to claim 5, wherein said VCO includes a bypass capacitor.

8. A radar system according to claim 1, wherein said VCO includes a GaAS field effect transistor or a MESFET, HEMT or PHEMT transistor oscillator.

9. A radar system according to claim 1, wherein said closed loop feedback circuit includes an IF amplifier coupled between said harmonic mixer and said linear frequency discriminator to amplify said IF signal.

10. A radar system according to claim 1, wherein said transmitter includes a summing amplifier coupled between said linear frequency discriminator and said VCO, said summing amplifier having a first input that is coupled to receive the output signal from the linear frequency discriminator, a second input that is coupled to receive a control signal, and an output that is coupled to an input of said VCO to control and stabilize the VCO.

11. A radar system according to claim 10, wherein said transmitter includes a linear ramp generator that is coupled to the second input of the summing amplifier, to provide said control signal.

12. A radar system according to claim 1, wherein said harmonic mixer is coupled to receive a radio frequency (RF) signal from an output of the VCO via a coupler and a microstrip transmission line.

13. A radar system according to claim 12, wherein said coupler is a microstrip component.

14. A radar system according to claim 1, wherein said harmonic mixer includes a radio-frequency bandpass filter, two diodes arranged in an anti-parallel configuration, a low-pass filter, and an intermediate frequency filter.

15. A radar system according to claim 1, wherein said linear frequency discriminator is a microstrip circuit including microstrip resonators.

16. A radar system according to claim 15, wherein said linear frequency discriminator includes a frequency divider, a power splitter, matching networks for the resonators, a plurality of diodes, matching networks for respective diodes, and an output port.

17. A radar system according to claim 1, wherein said linear frequency discriminator is a microstrip circuit including delay lines.

18. A radar system according to claim 17, wherein said linear frequency discriminator is a microstrip circuit that includes two branch line couplers, delay and reference paths, a microwave load, and two output diodes.

19. A radar system according to claim 17, wherein said linear frequency discriminator is a microstrip circuit that includes two hybrid ring couplers, delay and reference paths, a microwave load, and two output ports.

20. A radar system according to claim 1, wherein said transmitter has an operating frequency in the range of about 30–220 GHz.

21. A radar system according to claim 1, wherein said transmitter has an operating frequency of approximately 94 GHz.

22. A radar system according to claim 1, wherein said receiver includes a receive antenna having an output for a received signal, a coupler coupled to said transmitter to detect a transmitted signal, a mixer coupled to the receive antenna and said coupler, said mixer being arranged to mix said received signal with said transmitted signal to obtain an intermediate frequency (IF) signal, a filter coupled to an output of said mixer to filter said IF signal, and an analog-to-digital converter coupled to receive said IF signal and arranged to provide a digital output signal that is coupled to an input of said signal processing unit.

23. A radar system according to claim 22, wherein said mixer is a radio-frequency hybrid ring mixer.

24. A radar system according to claim 1, wherein said planar phased array comprises a dielectric substrate, and a rectangular array of microstrip elements on the dielectric substrate.

25. A radar system according to claim 24, wherein said microstrip elements are coupled together by a series of diagonal high impedance lines.

26. A radar system according to claim 1, wherein said planar phased array is conformable to a supporting body.

27. A radar system according to claim 1, including a plurality of planar phased arrays coupled together to form an interferometer.

28. A radar system according to claim 1, wherein said radar system includes a microstrip circuit.

29. A radar system according to claim 1, wherein said radar system includes a monolithic millimeter wave integrated circuit.

* * * * *